(12) United States Patent
Zhu et al.

(10) Patent No.: US 11,942,566 B2
(45) Date of Patent: Mar. 26, 2024

(54) THIN-FILM SEMICONDUCTOR OPTOELECTRONIC DEVICE WITH TEXTURED FRONT AND/OR BACK SURFACE PREPARED FROM ETCHING

(71) Applicant: Utica Leaseco, LLC, Rochester Hills, MI (US)

(72) Inventors: Yan Zhu, Dublin, CA (US); Sean Sweetnam, Menlo Park, CA (US); Brendan M. Kayes, Los Gatos, CA (US); Melissa J. Archer, San Jose, CA (US); Gang He, Cupertino, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 118 days.

(21) Appl. No.: 17/347,314

(22) Filed: Jun. 14, 2021

(65) Prior Publication Data

US 2021/0305452 A1  Sep. 30, 2021

Related U.S. Application Data

(60) Division of application No. 15/422,218, filed on Feb. 1, 2017, now Pat. No. 11,038,080, which is a
(Continued)

(51) Int. Cl.
*H01L 33/00* (2010.01)
*H01L 31/0216* (2014.01)
(Continued)

(52) U.S. Cl.
CPC .... *H01L 33/0093* (2020.05); *H01L 31/02168* (2013.01); *H01L 31/02366* (2013.01);
(Continued)

(58) Field of Classification Search
None
See application file for complete search history.

(56) References Cited

U.S. PATENT DOCUMENTS

| 3,615,853 A | 10/1971 | Goldsmith et al. |
| 3,838,359 A | 9/1974 | Hakki et al. |

(Continued)

FOREIGN PATENT DOCUMENTS

| CN | 1574388 A | 2/2005 |
| CN | 102007582 A | 4/2011 |

(Continued)

OTHER PUBLICATIONS

Advisory Action dated Apr. 13, 2016 for U.S. Appl. No. 13/446,876 of Kayes, B.M. et al. filed Apr. 13, 2012.
(Continued)

*Primary Examiner* — Evren Seven
(74) *Attorney, Agent, or Firm* — ARENTFOX SCHIFF LLP

(57) ABSTRACT

A method is provided for preparing at least one textured layer in an optoelectronic device. The method includes epitaxially growing a semiconductor layer of the optoelectronic device over a growth substrate; exposing the semiconductor layer to an etching process to create the at least one textured surface on the semiconductor layer; and lifting the optoelectronic device from the growth substrate.

10 Claims, 14 Drawing Sheets

Related U.S. Application Data continuation-in-part of application No. 15/340,560, filed on Nov. 1, 2016, now Pat. No. 10,008,628, which is a continuation of application No. 14/452,393, filed on Aug. 5, 2014, now Pat. No. 9,502,594, which is a continuation-in-part of application No. 13/354,175, filed on Jan. 19, 2012, now Pat. No. 9,136,422.

(51) Int. Cl.
| | |
|---|---|
| *H01L 31/0236* | (2006.01) |
| *H01L 31/056* | (2014.01) |
| *H01L 31/18* | (2006.01) |
| *H01L 33/22* | (2010.01) |
| *H01L 33/30* | (2010.01) |
| *H01L 33/42* | (2010.01) |
| *H01L 33/44* | (2010.01) |
| *H01L 33/46* | (2010.01) |

(52) U.S. Cl.
CPC ........ *H01L 31/056* (2014.12); *H01L 31/1892* (2013.01); *H01L 33/0062* (2013.01); *H01L 33/22* (2013.01); *H01L 33/30* (2013.01); *H01L 33/42* (2013.01); *H01L 33/44* (2013.01); *H01L 33/46* (2013.01); *H01L 2933/0016* (2013.01); *H01L 2933/0025* (2013.01); *H01L 2933/0091* (2013.01); *Y02E 10/52* (2013.01)

(56) References Cited

U.S. PATENT DOCUMENTS

| | | |
|---|---|---|
| 3,990,101 A | 11/1976 | Ettenberg et al. |
| 4,015,280 A | 3/1977 | Matsushita et al. |
| 4,017,332 A | 4/1977 | James |
| 4,094,704 A | 6/1978 | Milnes |
| 4,107,723 A | 8/1978 | Kamath |
| 4,191,593 A | 3/1980 | Cacheux |
| 4,197,141 A | 4/1980 | Bozler et al. |
| 4,295,002 A | 10/1981 | Chappell et al. |
| 4,338,480 A | 7/1982 | Antypas et al. |
| 4,385,198 A | 5/1983 | Rahilly |
| 4,400,221 A | 8/1983 | Rahilly |
| 4,410,758 A | 10/1983 | Grolitzer |
| 4,419,533 A | 12/1983 | Czubatyj et al. |
| 4,444,992 A | 4/1984 | Cox, III |
| 4,479,027 A | 10/1984 | Todorof |
| 4,497,974 A | 2/1985 | Deckman et al. |
| 4,543,441 A | 9/1985 | Kumada et al. |
| 4,571,448 A | 2/1986 | Barnett |
| 4,582,952 A | 4/1986 | McNeely et al. |
| 4,633,030 A | 12/1986 | Cook |
| 4,667,059 A | 5/1987 | Olson |
| 4,773,945 A | 9/1988 | Woolf et al. |
| 4,775,639 A | 10/1988 | Yoshida |
| 4,889,656 A | 12/1989 | Flynn et al. |
| 4,916,503 A | 4/1990 | Uematsu et al. |
| 4,989,059 A | 1/1991 | Micheels et al. |
| 4,997,491 A | 3/1991 | Hokuyo et al. |
| 5,101,260 A | 3/1992 | Nath et al. |
| 5,103,268 A | 4/1992 | Yin et al. |
| 5,116,427 A | 5/1992 | Fan et al. |
| 5,136,351 A | 8/1992 | Inoue et al. |
| 5,217,539 A | 6/1993 | Fraas et al. |
| 5,223,043 A | 6/1993 | Olson et al. |
| 5,230,746 A | 7/1993 | Wiedeman et al. |
| 5,231,931 A | 8/1993 | Sauvageot |
| 5,316,593 A | 5/1994 | Olson et al. |
| 5,330,585 A | 7/1994 | Chang et al. |
| 5,342,453 A | 8/1994 | Olson |
| 5,356,488 A | 10/1994 | Hezel |
| 5,376,185 A | 12/1994 | Wanlass |
| 5,385,960 A | 1/1995 | Emmons et al. |
| 5,465,009 A | 11/1995 | Drabik et al. |
| 5,468,652 A | 11/1995 | Gee |
| 6,107,563 A | 8/2000 | Nakanishi et al. |
| 6,166,218 A | 12/2000 | Ravichandran et al. |
| 6,166,318 A | 12/2000 | Freeouf |
| 6,229,084 B1 | 5/2001 | Katsu |
| 6,231,931 B1 | 5/2001 | Blazey et al. |
| 6,255,580 B1 | 7/2001 | Karam et al. |
| 6,262,359 B1 * | 7/2001 | Meier ............ H01L 31/022425 136/258 |
| 6,372,981 B1 | 4/2002 | Ueda et al. |
| 6,452,091 B1 | 9/2002 | Nakagawa et al. |
| 6,534,336 B1 | 3/2003 | Iwane et al. |
| 6,617,508 B2 | 9/2003 | Kilmer et al. |
| 7,038,250 B2 | 5/2006 | Sugiyama et al. |
| 7,875,945 B2 | 1/2011 | Krasnov et al. |
| 8,183,081 B2 | 5/2012 | Weidman et al. |
| 8,258,596 B2 | 9/2012 | Nasuno et al. |
| 8,664,515 B2 | 3/2014 | Hong et al. |
| 8,697,553 B2 | 4/2014 | Adibi et al. |
| 8,728,922 B2 * | 5/2014 | Krokoszinski ...... H01L 31/1804 438/548 |
| 8,895,845 B2 | 11/2014 | Kizilyalli et al. |
| 8,895,846 B2 | 11/2014 | Kizilyalli et al. |
| 8,937,244 B2 | 1/2015 | Kizilyalli et al. |
| 8,993,873 B2 | 3/2015 | Youtsey et al. |
| 9,099,595 B2 | 8/2015 | King et al. |
| 9,136,418 B2 | 9/2015 | Nie et al. |
| 9,136,422 B1 | 9/2015 | Higashi et al. |
| 9,178,099 B2 | 11/2015 | Nie et al. |
| 9,502,594 B2 | 11/2016 | Ding et al. |
| 9,537,025 B1 | 1/2017 | Kayes et al. |
| 9,691,921 B2 | 6/2017 | Atwater et al. |
| 9,768,329 B1 | 9/2017 | Kayes et al. |
| 2001/0027805 A1 | 10/2001 | Ho et al. |
| 2002/0000244 A1 | 1/2002 | Zaidi |
| 2002/0053683 A1 | 5/2002 | Hill et al. |
| 2002/0144724 A1 | 10/2002 | Kilmer et al. |
| 2002/0179141 A1 | 12/2002 | Ho et al. |
| 2003/0070707 A1 | 4/2003 | King et al. |
| 2003/0140962 A1 | 7/2003 | Sharps et al. |
| 2003/0222278 A1 | 12/2003 | Liu et al. |
| 2004/0112426 A1 | 6/2004 | Hagino |
| 2004/0166681 A1 | 8/2004 | Iles et al. |
| 2004/0200523 A1 | 10/2004 | King et al. |
| 2005/0001233 A1 | 1/2005 | Sugiyama et al. |
| 2005/0022863 A1 | 2/2005 | Agostinelli et al. |
| 2006/0081963 A1 | 4/2006 | Rehder et al. |
| 2006/0090790 A1 | 5/2006 | Kobayashi et al. |
| 2006/0144435 A1 | 7/2006 | Wanlass |
| 2006/0162767 A1 | 7/2006 | Mascarenhas et al. |
| 2006/0207651 A1 | 9/2006 | Posthuma et al. |
| 2006/0255340 A1 | 11/2006 | Manivannan et al. |
| 2007/0040233 A1 | 2/2007 | Kariya |
| 2007/0131275 A1 | 6/2007 | Kinsey et al. |
| 2007/0137695 A1 | 6/2007 | Fetzer et al. |
| 2007/0137698 A1 | 6/2007 | Wanlass et al. |
| 2007/0151596 A1 | 7/2007 | Nasuno et al. |
| 2007/0166862 A1 | 7/2007 | Kim et al. |
| 2007/0199591 A1 | 8/2007 | Harder et al. |
| 2007/0235074 A1 | 10/2007 | Henley et al. |
| 2007/0277874 A1 | 12/2007 | Dawson-Elli et al. |
| 2008/0128020 A1 | 6/2008 | Zafar et al. |
| 2008/0245409 A1 | 10/2008 | Varghese et al. |
| 2009/0151784 A1 | 6/2009 | Luan et al. |
| 2009/0283802 A1 | 11/2009 | Henderson et al. |
| 2009/0288703 A1 | 11/2009 | Stan et al. |
| 2010/0006143 A1 | 1/2010 | Welser |
| 2010/0015751 A1 | 1/2010 | Weidman et al. |
| 2010/0047959 A1 | 2/2010 | Cornfeld et al. |
| 2010/0055397 A1 * | 3/2010 | Kurihara ................ B29C 33/42 428/141 |
| 2010/0065117 A1 | 3/2010 | Kim et al. |
| 2010/0089443 A1 | 4/2010 | Bloomstein et al. |
| 2010/0096010 A1 | 4/2010 | Welser |
| 2010/0126552 A1 | 5/2010 | Kizilyalli et al. |
| 2010/0126570 A1 | 5/2010 | Kizilyalli et al. |
| 2010/0126571 A1 | 5/2010 | Kizilyalli et al. |
| 2010/0126572 A1 | 5/2010 | Kizilyalli et al. |
| 2010/0132774 A1 | 6/2010 | Borden |

(56) References Cited

U.S. PATENT DOCUMENTS

| | | | |
|---|---|---|---|
| 2010/0132780 A1 | 6/2010 | Kizilyalli et al. | |
| 2010/0193002 A1 | 8/2010 | Dimroth et al. | |
| 2010/0218819 A1 | 9/2010 | Farmer et al. | |
| 2010/0270653 A1 | 10/2010 | Leitz et al. | |
| 2010/0294349 A1 | 11/2010 | Srinivasan et al. | |
| 2010/0294356 A1 | 11/2010 | Parikh et al. | |
| 2010/0300506 A1 | 12/2010 | Heng et al. | |
| 2011/0083722 A1 | 4/2011 | Atwater et al. | |
| 2011/0088771 A1 | 4/2011 | Lin et al. | |
| 2011/0108098 A1 | 5/2011 | Kapur | |
| 2011/0156000 A1 | 6/2011 | Cheng | |
| 2011/0189817 A1 | 8/2011 | Takahashi et al. | |
| 2011/0214728 A1 | 9/2011 | Veerasamy | |
| 2011/0244692 A1 | 10/2011 | Jeong et al. | |
| 2011/0290322 A1 | 12/2011 | Meguro et al. | |
| 2012/0024336 A1 | 2/2012 | Hwang | |
| 2012/0031478 A1 | 2/2012 | Boisvert et al. | |
| 2012/0055541 A1 | 3/2012 | Granek et al. | |
| 2012/0067423 A1 | 3/2012 | Lochtefeld et al. | |
| 2012/0104411 A1 | 5/2012 | Iza et al. | |
| 2012/0125256 A1 | 5/2012 | Kramer et al. | |
| 2012/0132930 A1 | 5/2012 | Young et al. | |
| 2012/0160296 A1* | 6/2012 | Laparra | H01L 31/02363 257/E31.13 |
| 2012/0164796 A1 | 6/2012 | Lowenthal et al. | |
| 2012/0227805 A1 | 9/2012 | Hermle et al. | |
| 2012/0247555 A1 | 10/2012 | Matsushita et al. | |
| 2012/0305059 A1 | 12/2012 | Kayes et al. | |
| 2012/0313204 A1* | 12/2012 | Haddad | H04H 20/57 257/E31.127 |
| 2013/0025654 A1 | 1/2013 | Bedell et al. | |
| 2013/0026481 A1 | 1/2013 | Xu et al. | |
| 2013/0043214 A1* | 2/2013 | Forrest | H01L 31/1896 428/457 |
| 2013/0112258 A1 | 5/2013 | Park et al. | |
| 2013/0153013 A1 | 6/2013 | Archer et al. | |
| 2013/0180578 A1* | 7/2013 | Ravi | H01L 21/02381 438/94 |
| 2013/0220396 A1 | 8/2013 | Janssen et al. | |
| 2013/0270589 A1 | 10/2013 | Kayes et al. | |
| 2013/0288418 A1 | 10/2013 | Wang et al. | |
| 2013/0337601 A1 | 12/2013 | Kapur et al. | |
| 2014/0076386 A1 | 3/2014 | King et al. | |
| 2014/0261611 A1 | 9/2014 | King et al. | |
| 2014/0312373 A1* | 10/2014 | Donofrio | H01L 33/42 257/98 |
| 2014/0349485 A1* | 11/2014 | Umekawa | G03F 7/0757 438/694 |
| 2015/0056743 A1* | 2/2015 | Karakida | H01L 31/02363 438/71 |
| 2015/0171261 A1 | 6/2015 | Domine | |
| 2015/0228835 A1 | 8/2015 | Kayes et al. | |
| 2015/0368833 A1 | 12/2015 | Farah | |
| 2015/0380576 A1 | 12/2015 | Kayes et al. | |
| 2016/0099385 A1* | 4/2016 | Kim | H01L 33/0093 438/93 |
| 2016/0104615 A1* | 4/2016 | Liu | H01L 21/02639 438/492 |
| 2016/0155881 A1 | 6/2016 | Kayes et al. | |
| 2017/0047471 A1 | 2/2017 | Ding et al. | |
| 2017/0141256 A1 | 5/2017 | Kayes et al. | |
| 2017/0148930 A1 | 5/2017 | Zhu et al. | |

FOREIGN PATENT DOCUMENTS

| | | |
|---|---|---|
| CN | 102257637 A | 11/2011 |
| CN | 102473743 A | 5/2012 |
| CN | 103952768 A | 7/2014 |
| EP | 595634 A | 5/1994 |
| EP | 2927968 A1 | 10/2015 |
| GB | 2501432 A | 10/2013 |
| JP | S63211775 A | 9/1988 |
| JP | H03285368 A | 12/1991 |
| JP | H06244443 A | 9/1994 |
| JP | H07007148 A | 1/1995 |
| JP | H08130321 A | 5/1996 |
| JP | H09213206 A | 8/1997 |
| KR | 100762772 B1 | 10/2007 |
| WO | 2065553 A1 | 8/2002 |
| WO | 2008100603 A1 | 8/2008 |
| WO | 2016123074 A1 | 8/2016 |

OTHER PUBLICATIONS

Advisory Action dated Jul. 22, 2011, for U.S. Appl. No. 12/605,108 of Kizilyalli, I.C. et al. on Nov. 23, 2009.

Aisaka et al., "Enhancement of upconversion Luminescence of Er Doped Al2O3 Films by Ag Islands Films," Applied Physics Letters, Apr. 2008, vol. 92, No. 132105, pp. 1-3.

Biteen et al., "Spectral Tuning of Plasmon-enhanced Silicon Quantum Dot Luminescence," Applied Physics Letters Mar. 31, 2006, vol. 88, pp. 1-3.

Chinese Office Action issued in Chinese Patent Application No. 201510475349.5 dated Nov. 30, 2016.

Chinese Office Action dated Jun. 23, 2016, for Chinese Patent Application No. 201110329046.4.

Contreras et al., "Wide bandgap CuIn, GaSe2 solar cells with improved energy conversion efficiency," Progress in Photovoltaics: Research and Applications, Apr. 2012, vol. 20, pp. 843-850.

Corrected Notice of Allowability dated Dec. 9, 2015 for U.S. Appl. No. 14/452,393 of Ding, 1.-K. et al. filed Aug. 5, 2014.

Corrected Notice of Allowability dated Jun. 26, 2017 for U.S. Appl. No. 13/705,064 of Kayes, B.M. et al. filed Dec. 4, 2012.

Corrected Notice of Allowability dated May 26, 2017, for U.S. Appl. No. 12/904,047 of Atwater, H. et al. filed Oct. 13, 2010.

Corrected Notice of Allowability dated Apr. 20, 2015 for U.S. Appl. No. 13/451,455 of Nie, H. et al. filed Jul. 19, 2012.

Corrected Notice of Allowability dated Aug. 17, 2015 for U.S. Appl. No. 13/451,455 of Nie, H. et al. filed Jul. 19, 2012.

Corrected Notice of Allowability dated Jun. 29, 2015 for U.S. Appl. No. 13/451,455 of Nie, H. et al. filed Jul. 19, 2012.

Dionne et al., "Highly Confined Photon Transport in Subwavelength Metallic Slot Waveguides," Nano Letters, 2006, vol. 6, No. 9, 1928-1932, 5 pages.

European Search Report dated Sep. 19, 2017 for European Patent Application No. 11187659.5, 11 pages.

Ex Parte Quayle Action dated Nov. 18, 2016 for U.S. Appl. No. 13/705,064 of Kayes, B.M. et al. filed Dec. 4, 2012.

Final Office Action dated Apr. 10, 2014 for U.S. Appl. No. 13/772,043 of Archer, M.J. et al. filed Feb. 20, 2013.

Final Office Action dated Apr. 20, 2017 for U.S. Appl. No. 13/446,876 of Kayes, B.M. et al. filed Apr. 13, 2012.

Final Office Action dated Apr. 26, 2012 for U.S. Appl. No. 12/605,108 of Kizilyalli, I.C. et al. on Nov. 23, 2009.

Final Office Action dated Apr. 28, 2011 for U.S. Appl. No. 12/605,108 of Kizilyalli, I.C. et al. on Nov. 23, 2009.

Final Office Action dated Aug. 14, 2014 for U.S. Appl. No. 13/354,175 of Higashi, G. et al. filed Jan. 19, 2012.

Final Office Action dated Aug. 6, 2012 for U.S. Appl. No. 12/939,077 of Nie, H. et al. filed Nov. 3, 2010.

Final Office Action dated Feb. 1, 2016 for U.S. Appl. No. 12/904,047 of Atwater, H. et al. filed Oct. 13, 2010.

Final Office Action dated Feb. 8, 2016 for U.S. Appl. No. 13/772,043 of Archer, M.J. et al. filed Feb. 20, 2013.

Final Office Action dated Jan. 26, 2017, for Korean Patent Application No. KR-20127012346, 4 pages.

Final Office Action dated Jan. 29, 2016 for U.S. Appl. No. 13/446,876 of Kayes, B.M. et al. filed Apr. 13, 2012.

Final Office Action dated Mar. 4, 2016 for U.S. Appl. No. 14/696,106 of Kayes, Brendan M. filed Apr. 24, 2015.

Final Office Action dated Mar. 8, 2017 for U.S. Appl. No. 15/006,003 of Kayes, B.M. et al. filed Jan. 25, 2016.

Final Office Action dated Nov. 6, 2015 for U.S. Appl. No. 13/705,064 of Kayes, B.M. et al. filed Dec. 4, 2012.

Final Office Action dated Oct. 18, 2011, for U.S. Appl. No. 12/940,876 of Kizilyalli, I.C. et al. filed Nov. 10, 2010.

(56) References Cited

OTHER PUBLICATIONS

Final Office Action dated Oct. 28, 2016 for U.S. Appl. No. 14/846,675 of Kayes, B.M. et al. filed Sep. 4, 2015.
Final Office Action dated Sep. 11, 2017 for U.S. Appl. No. 12/904,047 of Atwater, H. et al. filed Oct. 13, 2010.
Final Office Action dated Sep. 16, 2011 for U.S. Appl. No. 12/940,861 of Kizilyalli, I.C. et al. filed Nov. 5, 2010.
Final Office Action dated Sep. 22, 2017 for U.S. Appl. No. 13/772,043 of Archer, M.J. et al. filed Feb. 20, 2013.
First Office Action dated Jun. 5, 2014, for Chinese Patent Application No. 201080046469 filed Oct. 14, 2010, 23 pages.
First Office Action dated Jun. 7, 2016 for Korean Patent Application No. KR-20127012346, 6 pages.
Floyd et al., "An N—AlGaAs P—GaAs graded heterojunction for high concentration ratios," 19th IEEE Photovoltaic Specialists Conference, 1987, pp. 81-86.
Heckelmann et al., "Investigations on AlxGa1-xAs Solar Cells Grown by MOVPE," IEEE Journal of Photovoltaics, IEEE, vol. 5, No. 1, Jan. 2015, pp. 446-453.
Hübner et al., "Novel cost-effective bifacial silicon solar cells with 19.4% front and 18.1 % rear efficiency," Applied Physics Letters, Feb. 24, 1997, vol. 70, No. 8, pp. 1008-1010.
International Search Report and Written Opinion dated Jun. 1, 2010 for International Application No. PCT/US2009/061906.
International Search Report and Written Opinion dated Jun. 1, 2010 for International Application No. PCT/US2009/061911.
International Search Report and Written Opinion dated Jun. 1, 2010 for International Application No. PCT/US2009/061914.
International Search Report and Written Opinion dated Jun. 1, 2010 for International Application No. PCT/US2009/061920.
International Search Report and Written Opinion dated Dec. 2, 2016 for International Patent Application No. PCT/US2016/052939, 12 pages.
International Search Report and Written Opinion dated Jun. 1, 2010 for International Application No. PCT/US2009/061898.
International Search Report and Written Opinion dated May 23, 2016 for International Patent Application No. PCT/US2016/014866, 12 pages.
International Search Report and Written Opinion dated May 8, 2017 for International Patent Application No. PCT/US2017/015387, 10 pages.
Kang et al., "Ultra-thin Film Nano-structured Gallium Arsenide Solar Cells," Proc. of SPIE, 2014, vol. 9277, No. 927718, pp. 1-7.
Lenkeit et al., "Excellent thermal stability of remote plasma-enhanced chemical vapour deposited silicon nitride films for the rear of screen-printed bifacial silicon solar cells," Solar Energy Materials & Solar Cells, 2001, vol. 65, pp. 317-323.
Lewis, Peter A., "Pigment Handbook vol. I: Properties and Economics, 2nd Edition", 1988, John Wiley & Sons, New York, pp. 790-791.
Restriction Requirement dated Dec. 28, 2017 for U.S. Appl. No. 15/422,218 of Zhu, Y. et al. filed Feb. 1, 2017.
Restriction Requirement dated Dec. 9, 2015 for U.S. Appl. No. 14/846,675 of Kayes, B.M. et al. filed Sep. 4, 2015.
Restriction Requirement dated Feb. 24, 2012 for U.S. Appl. No. 12/939,077 of Nie, H. et al. filed Nov. 3, 2010.
Restriction Requirement dated Jan. 22, 2013 for U.S. Appl. No. 12/904,047 of Atwater, H. et al. filed Oct. 13, 2010.
Restriction Requirement dated Jun. 22, 2016 for U.S. Appl. No. 15/006,003 of Kayes, B.M. et al. filed Jan. 25, 2016.
Restriction Requirement dated Nov. 18, 2016, for U.S. Appl. No. 14/692,647 of Kayes, Brendan M. et al. filed Apr. 21, 2015.
Restriction Requirement dated Oct. 24, 2014 for U.S. Appl. No. 13/705,064 of Kayes, B.M. et al. filed Dec. 4, 2012.
Sanfacon et al., "Analysis of AlGaAs/GaAs Solar Cell Structures by Optical Reflectance Spectroscopy," IEEE Transactions on Electron Devices, vol. 37, No. 2, Feb. 1990, pp. 450-454.
Search Report dated Jun. 5, 2014, for Chinese Patent Application No. 201080046469 filed Oct. 14, 2010, 2 pages.
Supplementary Search Report dated Sep. 18, 2017 for Chinese Patent Application No. 201510475349.5, 1 page.
Takamoto et al., "Paper-thin InGaP/GaAs solar cells," IEEE PVSC Proceedings, 2006, pp. 1769-1772.
Tanabe et al., "Direct-bonded GaAs/InGaAs Tandem Solar Cell," Applied Physics Letters, 2006, vol. 89, No. 102106, pp. 1-3.
Tsatsul'Nikov et al., "Volmer-Weber and Stranski-Krastanov InAs—Al, Ga quantum dots emitting at 1.3um," Journal of Applied Physics, Dec. 2000, vol. 88, No. 11, pp. 6272-6275.
U.S. Appl. No. 13/705,064 of Kayes, B.M. et al. filed Dec. 4, 2012.
U.S. Appl. No. 13/772,043 of Archer, M.J. et al. filed Feb. 20, 2013.
U.S. Appl. No. 14/846,675 of Kayes, B.M. et al. filed Sep. 4, 2015.
U.S. Appl. No. 15/417,105 of Kayes, B.M. et al. filed Jan. 26, 2017.
U.S. Appl. No. 15/706,090 of Kayes, B.M. et al. filed Sep. 15, 2017.
U.S. Appl. No. 15/837,533 of Kayes, B.M. et al. filed Dec. 11, 2017.
Van Geelen et al., "Epitaxial lift-off GaAs solar cell from a reusable GaAs substrate," Materials Science and Engineering: B, Mar. 1997, vol. 45, No. 1-3, pp. 162-171.
Van Wijngaarden et al., "Direct Imaging of Propagation and Damping of Near-Resonance Surface Plasmon Polaritons using Cathodoluminescence Spectroscopy," Applied Physics Letters, 2006, vol. 88, No. 22, pp. 1-3.
Yamaguchi et al., "Development Status of Space Solar Sheet", IEEE PVSC Proceedings, 2008, 2 pages.
Yang et al., "Ultra-Thin GaAs Single-Junction Solar Cells Integrated with an AlInP Layer for Reflective Back Scattering," Journal of Applied Physics, May 2014, vol. 115, No. 20, 4 pages.
Yazawa, Y. et al., "GaInP single-junction and GaInP/GaAs two-junction thin-film solar cell structures by epitaxial lift-off," Solar Energy Materials and Solar Cells, 1998, vol. 50, pp. 229-235.
Zhang et al., "Effects of Displaced p—n Junction of Heterojunction Bipolar Transistors," IEEE Transactions on Electron Devices, Nov. 1992, vol. 39, No. 11, pp. 2430-2437.
Lezec et al., "Negative Refraction at Visible Frequencies," Science, 2007, vol. 316, pp. 430-432.
Mathews et al., "GaAs solar cells for Indoor Light Harvesting," 2014 IEEE 40th Photovoltaic Specialist Conference PVSC, IEEE, Jun. 8, 2014, pp. 510-513.
Mcclelland et al., "High-Efficiency Thin-Film GAAS Bifacial Solar Cells," Proceedings of IEEE Photovoltaic Specialists Conference, May 21-25, 1990, pp. 145-147.
Mcpheeters et al., "Computational analysis of thin film InGaAs/GaAs quantum well solar cells with backside light trapping structures," Optics Express, vol. 20, No. S6, Nov. 5, 2012, pp. A864-A878.
Mellor et al., "A numerical study of Bi-periodic binary diffraction gratings for solar cell applications," Solar Energy Materials & Solar Cells, 2011, vol. 95, pp. 3527-3535.
Nielson et al., "Microfabrication of microsystem-enabled photovoltaic (MEPV) cells," Proceedings of the International Society of Optics and Photonics (SPIE) [online], Jan. 25, 2011. Retrieved from the Internet <URL: http://photovoltaics.sandia.gov/Pubs_2010/2011/Microfab_of_MEPV_Cells_SPIE_2011.pdf>. See entire document especially Figure 5, p. 5.
Non-Final Office Action issued in U.S. Appl. No. 15/422,218 dated May 9, 2018.
Non-Final Office Action dated Apr. 16, 2012 for U.S. Appl. No. 12/939,077 of Nie, H. et al. filed Nov. 3, 2010.
Non-Final Office Action dated Apr. 25, 2015 for U.S. Appl. No. 13/705,064 of Kayes, B.M. et al. filed Dec. 4, 2012.
Non-Final Office Action dated Apr. 7, 2016 for U.S. Appl. No. 13/705,064 of Kayes, B.M. et al. filed Dec. 4, 2012.
Non-Final Office Action dated Apr. 7, 2016 for U.S. Appl. No. 14/846,675 of Kayes, B.M. et al. filed Sep. 4, 2015.
Non-Final Office Action dated Apr. 7, 2017 for U.S. Appl. No. 13/772,043 of Archer, M.J. et al. filed Feb. 20, 2013.
Non-Final Office Action dated Aug. 16, 2017 for U.S. Appl. No. 14/846,675 of Kayes, B.M. et al. filed Sep. 4, 2015.
Non-Final Office Action dated Aug. 19, 2011 for U.S. Appl. No. 12/605,108 of Kizilyalli, I.C. et al. on Nov. 23, 2009.
Non-Final Office Action dated Jan. 16, 2014 for U.S. Appl. No. 12/904,047 of Atwater, H. et al. filed Oct. 13, 2010.

(56) References Cited

OTHER PUBLICATIONS

Non-Final Office Action dated Jan. 30, 2014 for U.S. Appl. No. 13/354,175 of Higashi, G. et al. filed Jan. 19, 2012.
Non-Final Office Action dated Jul. 16, 2015 for U.S. Appl. No. 13/446,876 of Kayes, B.M. et al. filed Apr. 13, 2012.
Non-Final Office Action dated Jul. 16, 2015 for U.S. Appl. No. 13/772,043 of Archer, M.J. et al. filed Feb. 20, 2013.
Non-Final Office Action dated Jul. 30, 2015 for U.S. Appl. No. 12/904,047 of Atwater, H. et al. filed Oct. 13, 2010.
Non-Final Office Action dated Jun. 28, 2016 for U.S. Appl. No. 13/446,876 of Kayes, B.M. et al. filed Apr. 13, 2012.
Non-Final Office Action dated Mar. 17, 2011, for U.S. Appl. No. 12/940,861 of Kizilyalli, I.C. et al. filed Nov. 5, 2010.
Non-Final Office Action dated Mar. 17, 2011, for U.S. Appl. No. 12/940,876 of Kizilyalli, I.C. et al. filed Nov. 10, 2010.
Non-Final Office Action dated May 11, 2017 for U.S. Appl. No. 14/692,647 of Kayes, Brendan M. et al. filed Apr. 21, 2015.
Non-Final Office Action dated May 31, 2016 for U.S. Appl. No. 12/904,047 of Atwater, H. et al. filed Oct. 13, 2010.
Non-Final Office Action dated Nov. 17, 2010 for U.S. Appl. No. 12/605,108 of Kizilyalli, I .C. et al. on Nov. 23, 2009.
Non-Final Office Action dated Nov. 17, 2015 for U.S. Appl. No. 14/696,106 of Kayes, Brendan M. filed Apr. 24, 2015.
Non-Final Office Action dated Nov. 2, 2017 for U.S. Appl. No. 15/340,560 of Ding, 1.-K. et al. filed Nov. 1, 2016.
Non-Final Office Action dated Sep. 22, 2016 for U.S. Appl. No. 15/006,003 of Kayes, B.M. et al. filed Jan. 25, 2016.
Non-Final Office Action dated Sep. 26, 2013 for U.S. Appl. No. 13/772,043 of Archer, M.J. et al. filed Feb. 20, 2013.
Notice of Allowance dated Aug. 12, 2014, for U.S. Appl. No. 12/940,876 of Kizilyalli, I.C. et al. filed Nov. 10, 2010.
Notice of Allowance dated Aug. 17, 2015 for U.S. Appl. No. 14/452,393 of Ding, 1.-K. et al. filed Aug. 5, 2014.
Notice of Allowance dated Aug. 26, 2016 for U.S. Appl. No. 14/696,106 of Kayes, Brendan M. filed Apr. 24, 2015.
Notice of Allowance dated Dec. 20, 2017 for U.S. Appl. No. 14/692,647 of Kayes, Brendan M. et al. filed Apr. 21, 2015.
Notice of Allowance dated Jan. 2, 2015 for U.S. Appl. No. 13/354,175 of Higashi, G. et al. filed Jan. 19, 2012.
Notice of Allowance dated Jul. 25, 2016 for U.S. Appl. No. 14/452,393 of Ding, 1.-K. et al. filed Aug. 5, 2014.
Notice of Allowance dated Jul. 31, 2014 for U.S. Appl. No. 12/940,861 of Kizilyalli, I.C. et al. filed Nov. 5, 2010.
Notice of Allowance dated Jun. 19, 2014 for U.S. Appl. No. 12/605,108 of Kizilyalli, I.C. et al. on Nov. 23, 2009.
Notice of Allowance dated Jun. 2, 2015 for U.S. Appl. No. 13/354,175 of Higashi, G. et al. filed Jan. 19, 2012.
Notice of Allowance dated Mar. 4, 2016 for U.S. Appl. No. 14/452,393 of Ding, 1.-K. et al. filed Aug. 5, 2014.
Notice of Allowance dated May 5, 2017 for U.S. Appl. No. 13/705,064 of Kayes, B.M. et al. filed Dec. 4, 2012.
Notice of Allowance dated Oct. 20, 2016 for U.S. Appl. No. 12/904,047 of Atwater, H. et al. filed Oct. 13, 2010.
Notice of Allowance dated Feb. 27, 2015 for U.S. Appl. No. 13/451,455 of Nie, H. et al. filed Jul. 19, 2012.
Notice of Allowance dated Jan. 26, 2015 for U.S. Appl. No. 13/451,455 of Nie, H. et al. filed Jul. 19, 2012.
Notice of Allowance with Corrected Notice of Allowability dated Feb. 28, 2017 for U.S. Appl. No. 12/904,047 of Atwater, H. et al. filed Oct. 13, 2010.
Ohtsuka et al., "Effect of light degradation on bifacial Si solar cells," Solar Energy Materials & Solar Cells, 2001, vol. 66, pp. 51-59.
Othaman et al, "The Stranski-Krastanov Three Dimensional Island Growth Prediction on Finite Size Model," Journal Fizik UTM, 2008, vol. 3, pp. 1-5.
Pacifici et al., "Quantitative Determination of Optical Transmission through Subwavelength Slit Arrays in Ag films: The Essential role of Surface Wave Interference and Local Coupling between Adjacent Slits," Thomas J. Watson Lab. of Appl. Phys., Oct. 22, 2007, pp. 1-4.
Park et al., "Surface Plasmon Enhanced Photoluminescence of Conjugated Polymers," Applied Physics Letters, 2007, vol. 90, No. 161107, 4 pages.
Pillai et al., "Enhanced emission from Si-based Light-emitting Diodes using Surface Plasmons," Applied Physics Letters, 2006, vol. 88, No. 161102, pp. 1-3.
Restriction Requirement dated Dec. 26, 2014 for U.S. Appl. No. 13/446,876 of Kayes, B.M. et al. filed Apr. 13, 2012.

* cited by examiner

THIN-FILM SEMICONDUCTOR OPTOELECTRONIC DEVICE WITH TEXTURED FRONT AND/OR BACK SURFACE PREPARED FROM ETCHING

CROSS-REFERENCE TO RELATED APPLICATIONS

This application is a Divisional Application of U.S. patent application Ser. No. 15/422,218, filed Feb. 1, 2017, which is a Continuation-in-Part Application of U.S. patent application Ser. No. 15/340,560, filed Nov. 1, 2016, now issued as U.S. Pat. No. 10,008,628, issued Jun. 26, 2018, which is a Continuation of U.S. patent application Ser. No. 14/452,393, filed Aug. 5, 2014, now U.S. Pat. No. 9,502,594, issued Nov. 22, 2016, which is a Continuation-in-Part Application of U.S. patent application Ser. No. 13/354,175, filed Jan. 19, 2012, now U.S. Pat. No. 9,136,422, issued Sep. 15, 2015. The disclosure of each of the priority applications is hereby incorporated in its entirety by reference.

BACKGROUND OF THE DISCLOSURE

Implementations of the disclosure generally relate to optoelectronic semiconductor devices, sometimes simply referred to as optoelectronic devices, such as photovoltaic (PV) devices including solar cells, or light emitting diodes (LEDs), and methods for fabricating such devices.

The use of optoelectronic devices, such as PV devices and LEDs, is becoming more widespread as energy efficiency increases in importance. In a PV device such as a solar cell, light is received by the PV device and the region around the junction of a solar cell absorbs photons from the light to produce electron-hole pairs, which are separated by the internal electric field of the junction to generate a voltage, thereby converting light energy to electric energy. The electric energy can be used directly to power electronic components and/or can be stored for use at a later time. The absorber layer, sometimes referred to as a base layer, of an ideal PV device can absorb the photons impinging on the PV device's front side facing the source of the light since the open circuit voltage ($V_{oc}$) or short circuit current ($I_{sc}$) is proportional to the light intensity. Several loss mechanisms, however, can typically interfere with the PV device's ability to have the absorber layer absorb the light reaching the front side of the PV device. For example, some photons can pass through the absorber layer without affecting any electron-hole pairs and thus never contributing to the generation of electrical energy by the PV device. In other cases, the semiconductor layers of the PV device can reflect a substantial portion of the impinging photons, preventing these photons from ever reaching the absorber layer. Texturing of one or more surface in the PV device or solar cell can improve light absorption and/or decrease reflection losses.

In an LED, the efficiency of the conversion of electrical energy into light energy can be reduced by internal reflection (also referred to as total internal reflection or TIR), which can trap the light inside the LED instead of having the light emitted from the device. Texturing of one or more surfaces in the LED can improve efficiency by making it easier for light to escape from the LED into its surrounding environment.

Accordingly, there is a need for optoelectronic devices with increased efficiency and methods for fabricating such optoelectronic devices at reduced costs and greater flexibility when compared to conventional optoelectronic device fabrication.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect, a method for providing at least one textured layer in an optoelectronic device is described. The method includes epitaxially growing a semiconductor layer of the optoelectronic device on a growth substrate. The semiconductor layer can be made of, for example, one or more Group III-V semiconductor materials. The method can also include exposing the semiconductor layer to an etching process to create or alter the at least one textured surface on the semiconductor layer. The at least one textured surface is configured to cause scattering of light. In an example, the at least one textured surface is configured to cause photons to scatter at randomized angles. The semiconductor layer with the at least one textured surface can be referred to as a textured semiconductor layer or simply as a textured layer. The method can also include lifting the optoelectronic device from the growth substrate (e.g., by using an epitaxial lift-off (ELO) process). Moreover, the at least one textured surface includes microscopically non-uniform features.

In another aspect, a method for providing an optoelectronic device is described. The method includes depositing a base layer and depositing an emitter layer on a substrate to form a p-n layer. The method can also include depositing a semiconductor layer of the optoelectronic device over the p-n layer. The semiconductor layer can be made of, for example, one or more Group III-V semiconductor materials. The method can further include exposing the semiconductor layer to an etching process to create or alter at least one textured surface on the semiconductor layer. The at least one textured surface is configured to cause scattering of light. In an example, the at least one textured surface is configured to cause photons to scatter at randomized angles. The p-n layer and the semiconductor layer may then be lifted from the substrate (e.g., by using an ELO process). Moreover, the at least one textured surface includes microscopically non-uniform features.

In another aspect, an optoelectronic device having at least one textured surface is described. The optoelectronic device can be made by performing a method that includes epitaxially growing a semiconductor layer of the optoelectronic device on a growth substrate, and exposing the semiconductor layer to an etching process to create the at least one textured surface on the semiconductor layer. The semiconductor layer can be made of, for example, one or more Group III-V semiconductor materials. The optoelectronic device may then be lifted off from the substrate (e.g., by using an ELO process). Moreover, the at least one textured surface includes microscopically non-uniform features.

In yet another aspect, the etching process described herein is performed without the use of a template layer, or similar layer, configured as a mask to generate texturing. The etching process can be done by one or more of a liquid or solution-based chemical etchant, gas etching, laser etching, plasma etching, or ion etching. Moreover, the at least one textured surface produced by the etching process includes microscopically non-uniform features resulting from inhomogeneous etching by the etching process.

The resulting optoelectronic device described herein may belong, but need not be limited, to one of the following categories of optoelectronic devices: a photovoltaic device, a photodetector, a diode, a photodiode, a light emitting diode, a laser, a laser diode, a quantum cascade laser, a transistor, a phototransistor, a photomultiplier, a resistor, a photoresistor, an optoisolator, or a charge-coupled device.

BRIEF DESCRIPTION OF THE DRAWINGS

The appended drawings illustrate only some implementations and are therefore not to be considered limiting of scope.

DETAILED DESCRIPTION

Figure 1A:
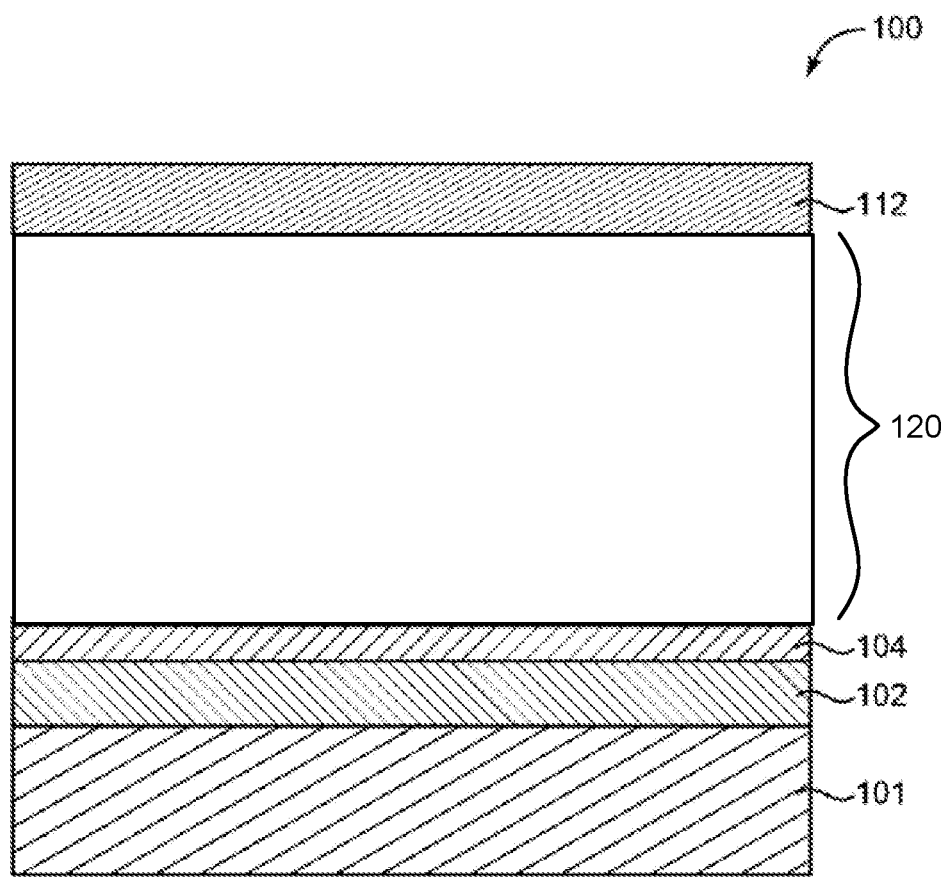
FIG. 1A illustrates a cross-sectional view of a photovoltaic device in accordance with aspects described in this disclosure.

Various aspects of this disclosure generally relate to optoelectronic devices and processes, and more specifically to optoelectronic semiconductor devices including one or more textured layers and the fabrication processes for forming such optoelectronic devices. Textured layers in this disclosure may refer to, for example, a semiconductor layer having at least one textured surface, where the semiconductor layer is part of an optoelectronic device.

Herein, a layer can be described as being deposited "on" or "over" one or more other layers. These terms indicate that the layer can be deposited directly on top of the other layer(s), or can indicate that one or more additional layers can be deposited between the layer and the other layer(s) in some implementations. Also, the other layer(s) can be arranged in any order.

Various implementations and aspects described herein for PV devices relate to light trapping using textured layer(s) for greater device efficiency. The various implementations and aspects described herein may also apply to LEDs to can improve efficiency by making it easier for light to escape (e.g., by scattering) from the LED into its surrounding environment.

The use of a lift-off process (e.g., ELO process) that grows a photovoltaic device sunny side down gives the opportunity to place light scattering texture on the back of the photovoltaic device (e.g., solar cell). The issue that may arise, particularly when the layer in the photovoltaic structure that is to be layered is grown (e.g., epitaxially grown), is how to produce such light scattering texturing in a way that is compatible with the fabrication techniques and costs for generating the photovoltaic device.

In some instances, when very thick semiconductor layers of semiconductor material are used, such as Group III-V semiconductor materials (e.g., GaAs, AlGaAs), applying different etchants (e.g., etching solutions) can randomly set up some non-uniformities on the surface of the semiconductor material that eventually generate texturing of the right dimensions or feature sizes to produce light scattering.

However, using such thick semiconductor layers when the semiconductor material is epitaxially grown can be quite costly because a significant amount of material needs to be etched away and, therefore, wasted. An epitaxially grown material may refer to a material grown as a layer or film, typically using precursors (e.g., gas and/or liquid precursors), over a substrate or other layer/film that acts as a seed crystal. Accordingly, it is preferable that the process of texturing is applied to a semiconductor layer grown with a minimal amount of epitaxial material (e.g., small thickness) to reduce the costs associated with generating the texturing.

One way of creating texturing for thin, epitaxially grown semiconductor layers is to use a template (e.g., a template layer) for explicit patterning using techniques such as photolithography, stamping, e-beam lithography, to name a few. Also, the use of spinning on microscopic or nanoscopic spheres that could provide an etching mask for plasma etching may be considered.

In addition to the use of templates, texturing can be produced by using mismatch layers where there is a lattice mismatch between a contact layer and the template layer, for example. Such layer mismatch allows for a random but controllable template layer. The template layer creates islands or regions with gaps between the islands and that provides a natural template where a selective etchant can etch between the islands to produce texturing.

By using an etching process that has a non-uniform etching rate with time (e.g., a temporally non-uniform etching process), a spatially non-uniform texturing may be generated on the surface of a semiconductor material that is suitable for light scattering without the need for a thick semiconductor layer, mismatch layers, and/or explicit patterning. Such etching process can create a spatially non-uniform texturing on semiconductor layers that may not be possible by straight acids.

In an example, when nitric acid is used as an etchant, a semiconductor layer may need to be about 4-5 microns thick to allow for the etching process to produce an appropriate texturing suitable for light scattering. By using an etching process that results in an inhomogeneous etching (e.g., that produces microscopically non-uniform features) of the semiconductor layer it is then possible to produce an appropriate level of texturing but with a much thinner semiconductor layer. For example, using such an etching process may require semiconductor layers having a 1-1.5 micron thickness, and it may be possible with sub-micron layers. Because the texturing needs to have feature sizes that are in the scale of hundreds of nanometers, the use of an initial semiconductor layer that is 1-1.5 micron thickness provides sufficient sacrificial material (e.g., material to be wasted through the etching process) to produce the appropriate level of texturing.

While photovoltaic cells based on crystalline silicon can use etching techniques to create light scattering surfaces, such techniques apply to silicon wafers that are very thick in comparison to epitaxially grown III-V semiconductor materials, and consequently, can have various microns of material wasted in the etching process. For any photovoltaic device based (or LED) on III-V semiconductor materials that are epitaxially grown, it would be cost prohibitive to provide texturing by removing one or more microns of sacrificial material.

For example, for a photovoltaic device having an absorber layer that is around 2 microns thick, and where there is a need to reduce the thickness to use less material in the device, the semiconductor layer to be textured may need to be thinner than the absorber layer to keep costs down. Therefore, for a photovoltaic device having an absorber layer that is 2 microns thick, or thinner, the semiconductor layer to be textured for light scattering can be in the range of 1-1.5 microns thick, or thinner. Using a semiconductor layer thicker than that, as used for crystalline silicon, would otherwise be too costly.

FIG. 1A illustrates a cross-sectional view of an implementation of a photovoltaic device 100 suitable for use with the various aspects for texturing described herein. That is, one or more layers of FIG. 1A may be textured using the texturing techniques described below. Although examples herein relate to photovoltaic devices, described features can also be applied to other optoelectronic semiconductor devices, such as light emitting diodes (LEDs), for example, to scatter light in the device to provide increased or more efficient light generation.

The optoelectronic device 100 includes a p-n layer 120 coupled with a growth wafer 101 by an epitaxial lift-off (ELO) release layer or sacrificial layer 104 disposed therebetween. Multiple layers of epitaxial materials containing varying compositions are deposited within the optoelectronic device 100. The various layers of epitaxial materials can be grown or otherwise formed by a suitable method for semiconductor growth, including epitaxial growth. The p-n layer 120 can be, for example, a gallium arsenide based optoelectronic device with layers made of Group III-V semiconductor materials. The Group III-V semiconductor materials are thin films of epitaxially grown layers. In some implementations the epitaxially grown layers can be formed by growing Group III-V semiconductor materials during, for example, a high growth rate vapor deposition process. A high growth rate deposition process allows for growth rates of greater than 5 microns/hour (µm/hr), such as about 10 µm/hr or greater, or as high as about 100 µm/hr or greater. As described in this disclosure, the term "about" may indicate a value that is within 1%, 2%, 5%, 10%, or 20% of a nominal value. The high growth rate process includes heating a wafer to a deposition temperature of about 550° C. or greater, within a processing system, exposing the wafer to a deposition gas containing a chemical precursor, such as gallium precursor gas and arsine for a gallium arsenide deposition process, and depositing a layer containing gallium arsenide on the wafer. The deposition gas can contain a Group V precursor, such as arsine, phosphine, or ammonia.

The deposition processes for depositing or forming Group III-V semiconductor materials, as described herein, can be conducted in various types of deposition chambers. For example, one continuous feed deposition chamber that can be utilized for growing, depositing, or otherwise forming Group III-V semiconductor materials is described in the commonly assigned U.S. patent application Ser. Nos. 12/475,131 and 12/475,169, both filed on May 29, 2009, which are herein incorporated by reference in their entireties.

Some examples of layers usable in photovoltaic device 100 and methods for forming such layers are disclosed in U.S. patent application Ser. No. 12/939,077, filed Nov. 3, 2010, and incorporated herein by reference in its entirety.

In some implementations, one or more buffer layers 102 can be formed on the growth wafer 101 in order to start forming the optoelectronic device 100. The growth wafer 101 can include, for example, a p-type, an n-type, or semi-insulating material, and can include the same or similar material as the one or more subsequently deposited buffer layers. The growth wafer 101 may be referred to as a substrate layer, growth substrate, or substrate.

A sacrificial layer (ELO release layer) 104 can be deposited on the growth wafer 101 or buffer layer 102 (if present). The sacrificial layer 104 can contain a suitable material, such as aluminum arsenide (AlAs), aluminum gallium arsenide (AlGaAs), indium aluminum arsenide (InAlAs), or another aluminum arsenide alloy, and is utilized to form a lattice structure for the layers contained within the p-n layer 120, and then etched and removed during the ELO process.

Figure 1B:
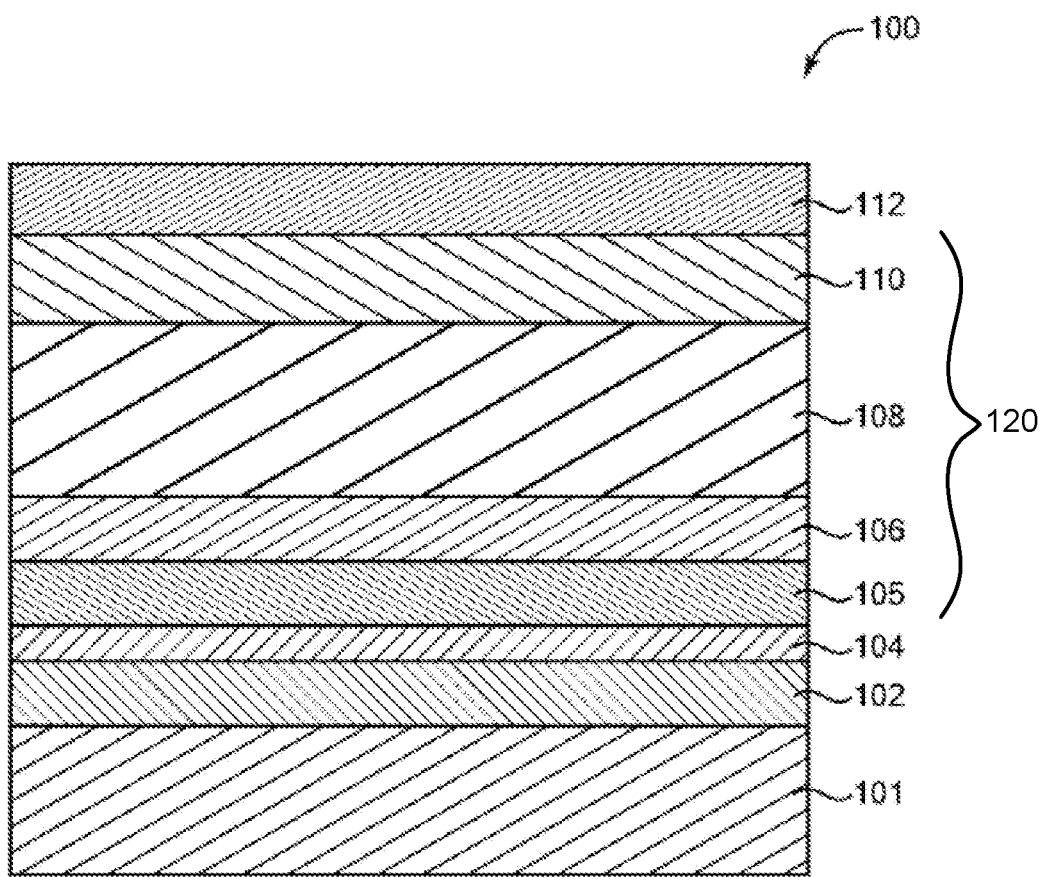
FIG. 1B illustrates a cross-sectional view of a photovoltaic device in accordance with aspects described in this disclosure

The p-n layer 120 can comprise multiple layers deposited over the sacrificial layer 104, which in some implementations can include one or more of a first contact layer, a first window layer, base layer, an emitter layer, and a second window layer. A second contact layer 112 can be deposited over the p-n layer 120. FIG. 1B shows an example of the photovoltaic device 100 in which the p-n layer 120 includes a first contact layer 105, a first window layer 106, a base layer 108, and an emitter layer 110. The first contact layer 105 may be referred to as a front contact layer, and the first window layer 106 may be referred to as a front window layer. A second window layer may be disposed opposite of the placement of the first window layer in the photovoltaic device 100. Any references in this disclosure to a p-n layer 120, or similar structure, may refer to the p-n layer 120 as described in the examples shown in FIGS. 1A and 1B, but need not be limited to the examples shown in FIGS. 1A and 1B. Moreover, when reference is made to the p-n layer 120, or portions of the p-n layer 120 (e.g., a subset of the layers), as described in FIG. 1B in certain embodiments or implementations in the figures, the p-n layer 120, or portions of the p-n layer 120 as described in FIG. 1A may be similarly applicable in those same embodiments or implementations.

In some implementations, the contact of the base layer with the emitter layer creates a p-n junction. Other implementations can include one or more intermediate layers between the base layer and the emitter layer. In some embodiments the p-n junction is a homojunction, in other embodiments it is a heterojunction. In some embodiments the at least one intermediate layer, if present, has graded doping and/or composition. In some embodiments the base layer is n-type while the emitter layer is p-type, while in other embodiments the base layer is p-type while the emitter layer is n-type. In some embodiments the p-n junction is closer to the first window layer than to the second window layer, while in other embodiments the p-n junction is closer to the second window layer than to the first window layer, while in yet other embodiments the p-n junction is equidistant from the first window layer and the second window layer.

A second contact layer 112 for texturing can optionally be deposited over the emitter layer 110 as in FIG. 1B, or over the p-n layer 120 as in FIG. 1A. The second contact layer 112 can provide a first layer on which a semiconductor layer (or multiple layers forming the semiconductor layer) is deposited for texturing purposes. In some implementations, the second contact layer 112 can be the semiconductor layer to be textured and no additional layer is provided for texturing. The semiconductor layer, when textured, may be referred to as a textured semiconductor layer. In some implementations, the second contact layer 112 can be monocrystalline, and n-doped or p-doped, and have a doping concentration in a range of about $5\times10^{17}$ cm$^{-3}$ to about $5\times10^{20}$ cm$^{-3}$. The second contact layer 112 is described in greater detail below. In some other implementations, the second contact layer 112 is not included in the optoelectronic device 100. For example, a semiconductor layer (described below) can be deposited on the p-n layer 120 without the need of the second contact layer 112.

A semiconductor layer to be textured can, but need not be, substantially etched away in the process of forming a textured surface, altering the textured surface, or both. That is, the semiconductor layer can be partially present after the etching process. In some implementations, the textured semiconductor layer may be used to form or produce another textured layer and the textured semiconductor layer could be partially or wholly removed in subsequent processing steps prior to completion of fabrication of the optoelectronic device.

The semiconductor layer can include a semiconductor material, and can be a different material than the material of the second contact layer 112 upon which the semiconductor layer is deposited (or different from the p-n layer 120 when a second contact layer 112 is not used). In some implementations, the semiconductor layer can be a material having a different band gap from the material of the second contact layer 112. In some examples, the semiconductor layer can comprise phosphorus, gallium, aluminum, indium, arsenic, antimony, nitrogen, derivatives thereof, and/or combinations thereof. For example, in some implementations, the second contact layer 112 can comprise gallium arsenide (GaAs) or aluminum gallium arsenide (AlGaAs), and the semiconductor layer can comprise gallium arsenide (GaAs), aluminum gallium arsenide (AlGaAs), indium gallium arsenide (InGaAs) or gallium arsenide antimonide (GaAsSb). In other implementations, the second contact layer 112 can comprise aluminum gallium arsenide (AlGaAs) and the semiconductor layer can comprise gallium arsenide (GaAs), aluminum gallium arsenide (AlGaAs), or gallium phosphide (GaP). In other implementations, the second contact layer 112 can comprise indium arsenide (InAs) and the semiconductor layer can comprise gallium arsenide (GaAs), aluminum gallium arsenide (AlGaAs), or indium arsenide antimonide (InAsSb). In still other implementations, the second contact layer 112 can comprise gallium indium phosphide (GaInP) and the semiconductor layer can comprise gallium arsenide (GaAs), aluminum gallium arsenide (AlGaAs), gallium phosphide (GaP) or aluminum phosphide (AlP). In still other implementations, the second contact layer 112 can comprise indium phosphide (InP) and the semiconductor layer can comprise gallium arsenide (GaAs), aluminum gallium arsenide (AlGaAs), or indium phosphide antimonide (InPSb). In some implementations, the semiconductor layer can comprise gallium indium nitride arsenide (GaInNAs), gallium nitride arsenide (GaNAs), gallium arsenide phosphide (GaAsP), aluminum gallium arsenide phosphide (AlGaAsP), or aluminum gallium phosphide (AlGaP). In any of these implementations, derivatives and/or combinations of these materials can be used. Some implementations can use a material for the semiconductor layer that is doped. For example, the semiconductor layer material can be n-doped or p-doped, and can have a doping concentration in a range of about $1\times10^{17}$ cm$^{-3}$ to about $5\times10^{20}$ cm$^{-3}$.

In some implementations, the semiconductor layer includes a material that has an index of refraction (n) and an absorption (k) that increases or maximizes the ability to scatter or reflect light. For example, semiconductor layer can comprise a transparent material to allow light to pass through the semiconductor layer. The term "transparent" as used herein refers to a negligible amount of absorption in the wavelength range of operation of the optoelectronic device. For example, in some implementations the semiconductor layer can have an index of refraction in a range of about 1 to about 6. Furthermore, in some implementations the material of the semiconductor layer can have an absorption (k) in a range of about 0 to about 5, such as about $1\times10^{-3}$ or about $1\times10^{-4}$. In some implementations, the semiconductor layer can comprise multiple transparent layers.

In some implementations, the semiconductor layer can include a layer of graded composition, for example, any of the Group III-V semiconductor materials where composition can be varied. In one implementation, the semiconductor layer comprises a graded layer which grades from aluminum gallium arsenide of one composition ($Al_xGa_{1-x}As$) to aluminum gallium arsenide of a different composition ($Al_yGa_{1-y}As$, where $x \neq y$).

In some implementations, the semiconductor layer can include a layer of graded doping. In one implementation, the semiconductor layer comprises a layer of graded doping which grades from a lower dopant concentration nearer the p-n layer to a higher dopant concentration farther from the p-n layer.

In some implementations, various parameters of the deposition process can be changed or tuned for the deposition of the semiconductor layer, as compared to the deposition parameters used during deposition of previous layers such as the second contact layer 112. For example, the temperature, pressure, deposition gas, and/or growth rate of the deposition process can be changed, as described in greater detail below.

Since a textured surface of the semiconductor layer is formed as a non-active scattering layer having features (e.g., non-uniform microscopic features) not provided within a base layer or an emitter layer, and since a greater degree of variation, irregularity or randomness is preferred in the textured formation, a high-quality semiconductor is not necessary as the material of the semiconductor layer in some implementations. This can allow some reduction in cost of materials and/or processing compared to previous techniques in which precisely-dimensioned and precisely-spaced islands were grown in absorber layers of a device (e.g., for tuning wavelength emissions in semiconductor lasers). In addition, the use of lesser-quality semiconductors for the semiconductor layer to be textured can allow higher growth rates of the semiconductor layer in some implementations. However, it is important that defect states in the semiconductor layer do not contribute significantly to parasitic absorption of light.

As described herein, to provide textures or texturing, etching can be performed on a semiconductor layer. The parameters of the etching can be controlled over the morphology and dimensions of the texture, thereby maximizing the benefit of the texture to the device performance. In various implementations, the etching can be one or more of chemical etching, laser etching, plasma etching, ion etching, or the like. Additional details regarding the spatially and microscopically non-uniform etching process of the present disclosure are provided below.

In some implementations the etching process is done by chemical etching. In some implementations that chemical etching creates a non-uniform surface. In some implementations the chemical etching has a spatially and/or temporally non-uniform etch rate (e.g., etch rate varies with position and/or time) that allows for the creation of a non-uniform surface (e.g., spatially non-uniform surface). In some implementations the chemical etching involves a mixture that can include one or more of inorganic acids, organic acids, bases, oxidizers, and/or solvents.

In an aspect, a semiconductor layer and the second contact layer 112 can be partially etched to create the appropriate texturing. In some implementations, the etching process to create the texturing may not be restricted to the second contact layer 112 and those layers above layer 112, but rather extends also to the p-n layer 120.

Figure 2:
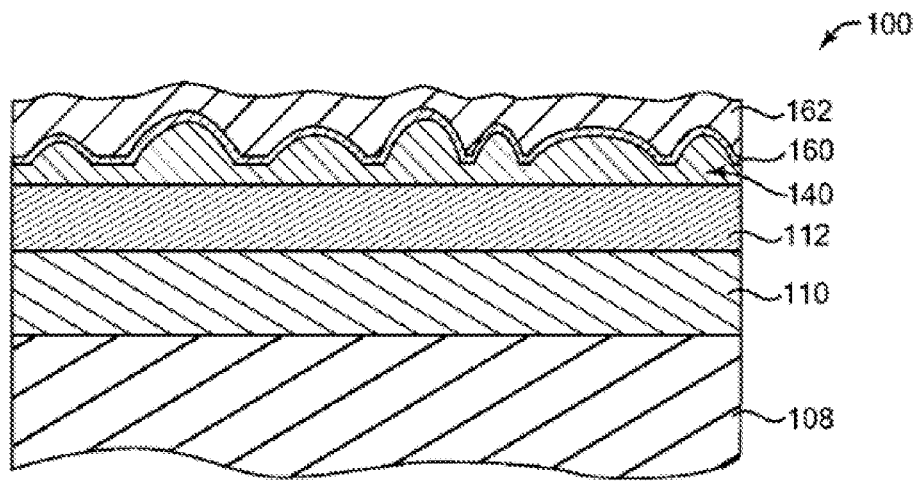
FIG. 2 illustrates a cross-sectional view of a photovoltaic device in which a semiconductor contact layer and dielectric layer have been deposited over a textured semiconductor layer in accordance with aspects described in this disclosure.

In FIG. 2, the photovoltaic device 100 of FIG. 1A or FIG. 1B has been further developed by depositing a semiconductor layer 140 over the second contact layer 112, an optional semiconductor contact layer 160 over the semiconductor layer 140, followed by the deposition of a layer 162 over the semiconductor contact layer 160 (if present) or over the semiconductor layer 140 (if the semiconductor contact layer 160 is not present). The layer 162 may be a dielectric layer, a transparent conductive oxide (TCO) layer, a high-resistivity transparent (HRT) layer, or some other similar layer. The semiconductor layer 140 is shown in the example Figures described below. The semiconductor layer 140 may be textured using the techniques and/or processes described herein to produce light scattering.

The semiconductor contact layer 160 can be deposited in some implementations to, for example, provide a cap on the semiconductor layer 140 and to allow other layers to be more easily deposited over the semiconductor layer 140, and/or to provide a better ohmic contact for charge carrier movement in the photovoltaic device 100. In some example implementations, the semiconductor contact layer 160 can be comprised of a semiconductor such as gallium arsenide (GaAs) (e.g., with lower thicknesses since it can be less transparent), aluminum gallium arsenide (AlGaAs) (e.g., with higher thicknesses since it can be more transparent), or other materials, and can be p-doped in some implementations, having a thickness in a range of about 5 nm to about 2500 nm.

The microscopic features (e.g., cavities, holes, trenches, etc.) of the textured surface of the semiconductor layer 140 can form recesses in the layer(s) deposited above the semiconductor layer 140, such that in a back reflector implementation, light traveling through the material of the semiconductor layer 140 impinges on and reflects off (e.g., is scattered by) the surfaces of the recesses. Some examples are shown in greater detail with respect to FIG. 9.

In another implementation, scattering particles may be introduced into the layer 162 as a mechanism to provide additional increases in scattering efficiency.

In some other implementations, a different material can be deposited instead of layer 162 over the semiconductor contact layer 160 or over the semiconductor layer 140 (if the semiconductor contact layer 160 is not present). For example, in some implementations, a transparent conducting oxide (TCO) layer can be deposited to provide boosted reflection abilities similar to a dielectric layer, and also provide a conductive path for charge carriers between the semiconductor layers and a conductive metal layer provided over the TCO layer. In these implementations, apertures such as those described for the layer 162 in FIG. 3 need not be formed in the TCO layer. In some implementations, a high-resistivity transparent (HRT) layer can also be provided between the TCO layer and a semiconductor layer (such as semiconductor layer 140, emitter layer 110, or absorber layer 108). The HRT layer can reduce shunting of charge carriers through pin holes in the semiconductor material. The HRT layer can be deposited using various processes including but not limited to, for example, screen printing, inkjet printing, evaporation techniques, spin coating, digital printing, screen print masking, and/or shadow masking.

Figure 3:
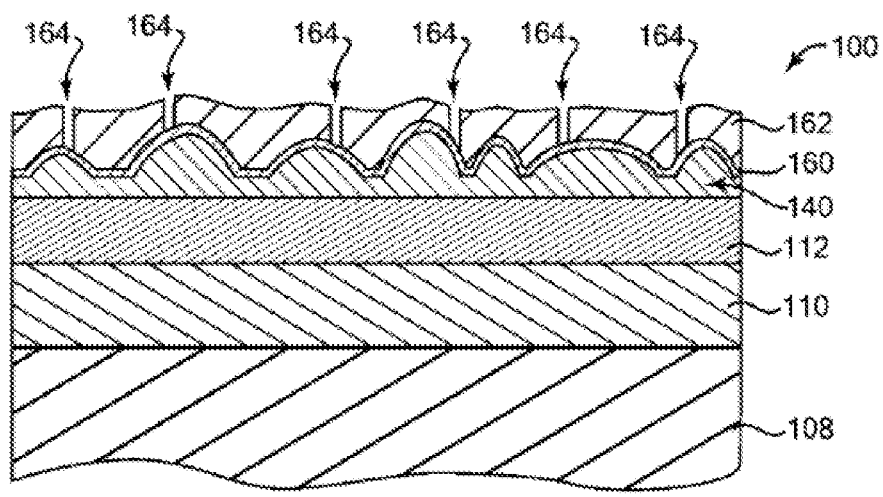
FIG. 3 illustrates a cross-sectional view of a photovoltaic device in which apertures have been formed in a dielectric layer in accordance with aspects described in this disclosure.

FIG. 3 illustrates the photovoltaic device 100 of FIG. 2 after apertures 164 have been formed in the layer 162 to allow a conductive contact through the layer 162. In implementations having the semiconductor contact layer 160, such as the example implementation shown in FIG. 3, the apertures 164 are formed through the layer 162 from the surface of the layer 162 to the semiconductor contact layer 160. In other implementations that do not have a semiconductor contact layer 160, the apertures 164 can be formed from the surface of the layer 162 to the semiconductor layer 140.

In some implementations, the apertures 164 are formed by etching using an etching process. The etching process can be performed using any of available suitable techniques.

Figure 4:
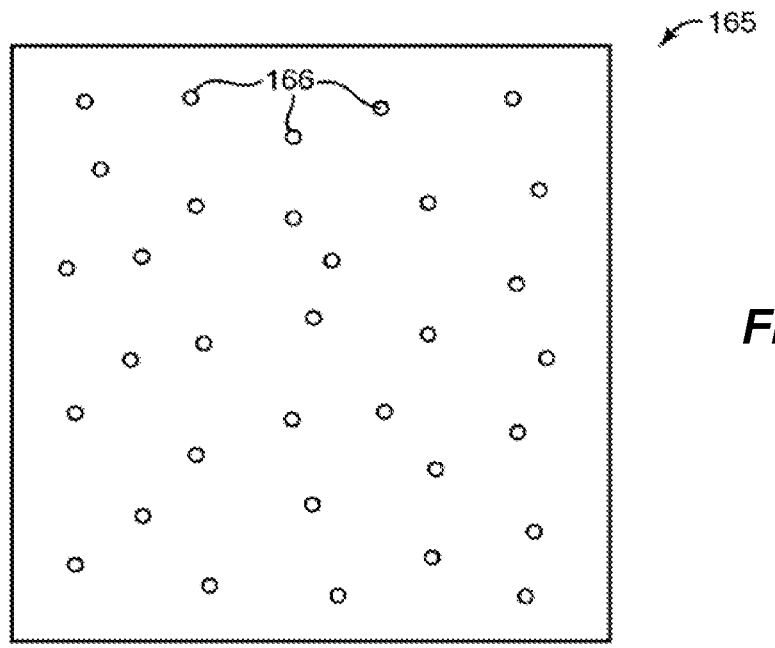
FIG. 4 illustrates a top plan view of an example of a mask which can be used to form apertures in a dielectric layer in accordance with aspects described in this disclosure.
Figure 5:
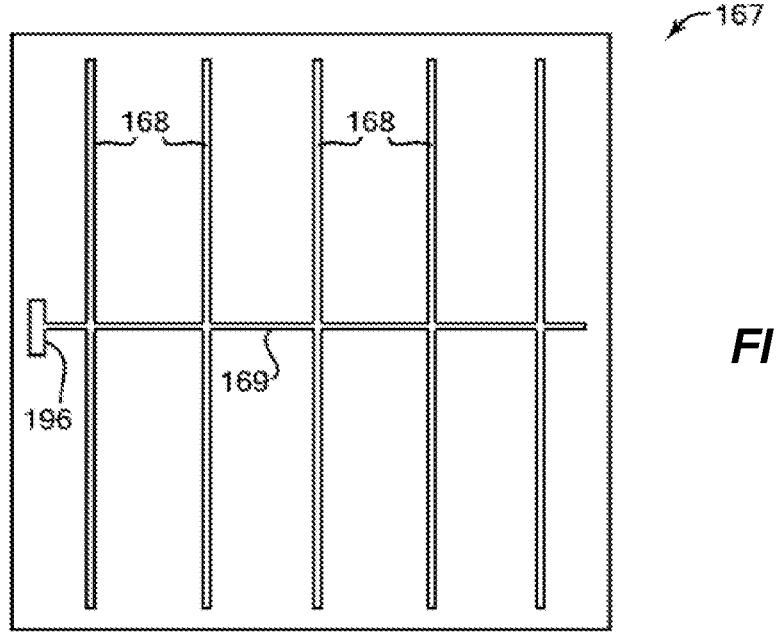
FIG. 5 illustrates a top plan view of another example of a mask which can be used to form apertures in a dielectric layer in accordance with aspects described in this disclosure.

In some example implementations, a particular pattern of apertures 164 in the layer 162 can be provided with a mask such as a photoresist/etching mask. FIG. 4 shows one example of a top view of a mask pattern 165 providing the apertures 164 in the layer 162, in which the apertures are circular holes 166 having an approximately circular cross section (approximately circular in the top view of FIG. 4). In other implementations, the holes may have other geometric shapes. In an example, the holes may be square holes rather than circular holes, with an approximately square cross-section. Moreover, the apertures 164 may have a periodic or irregular/random spacing. FIG. 5 shows another example of a top of view of a mask pattern 167 providing the apertures 164 in the layer 162, in which the apertures are linear grooves. One or more grooves 168 can intersect one or more other grooves 169 as shown. The grooves can be positioned approximately parallel and/or perpendicular to each other as shown, or can be positioned at various other angles in other implementations. The grooves need not be uniformly spaced. Non-linear or irregular grooves can be used in other implementations. In other implementations, a direct or maskless patterning process may be used. Layer 162 layer can be deposited using various processes including but not limited to, for example, screen printing, inkjet printing, evaporation techniques, spin coating, digital printing, screen print masking, and/or shadow masking.

Figure 6:
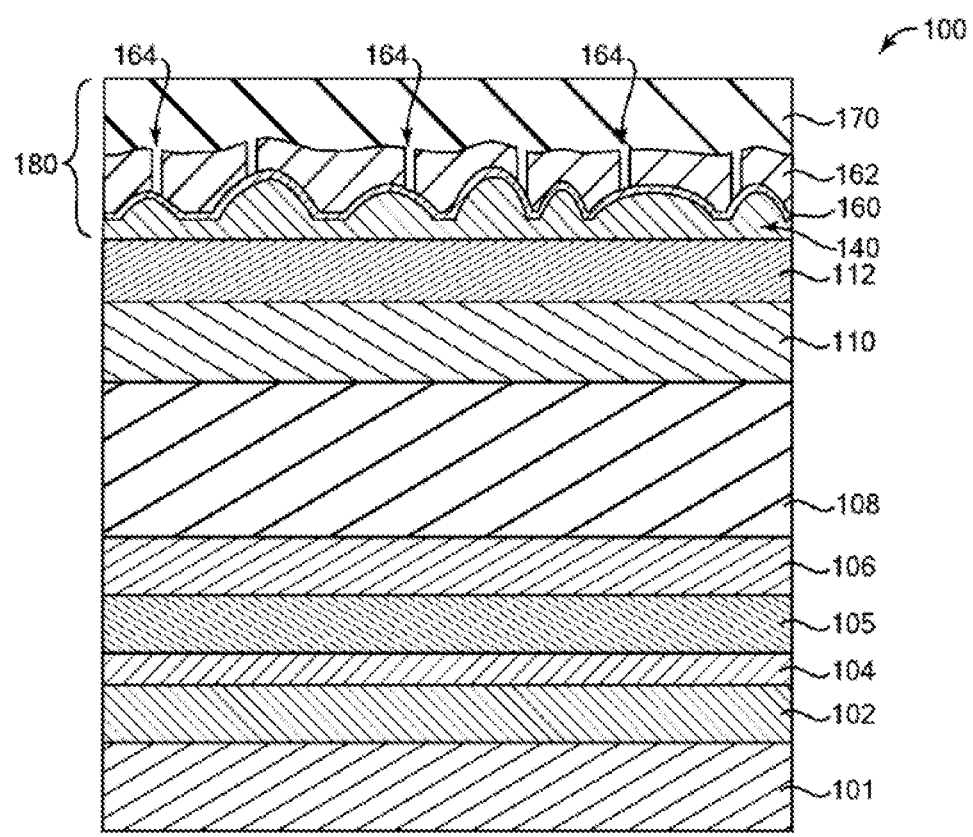
FIG. 6 illustrates a cross-sectional view of a photovoltaic device in which a metal layer has been deposited on a dielectric layer in accordance with aspects described in this disclosure.

In FIG. 6, the photovoltaic device 100 has been further developed by depositing a reflective back metal layer 170 over the layer 162, providing one example of a textured layer 180. The textured layer 180 may include the textured semiconductor layer 140. A reference to a textured layer may be a reference to the textured layer 180 or the textured semiconductor layer 140, for example.

The metal layer 170 comprises a metal that reflects light efficiently. For example, in some implementations the metal layer 170 can be comprised of gold, silver, copper, platinum, aluminum, or other reflective metals, derivatives thereof, and/or combinations thereof. The metal layer 170 may be deposited using different techniques including, but not limited to, sputtering, evaporation, and/or plating. The deposition of the metal layer 170 provides an approximately flat surface opposite to the semiconductor layer 140. In some implementations, the semiconductor layer 140 has received etching (e.g., temporally non-uniform etching) prior to subsequent processing steps. In some implementations, the metal layer 170 can have an average thickness in a range of about 50 nm to about 10 µm. The material of the metal layer 170 also is deposited into the apertures 164 so that a conductive contact is made between the metal layer 170 and the semiconductor contact layer 160, or between the metal layer 170 and the semiconductor layer 140 if the semiconductor contact layer 160 is not present. In some other implementations, the metal layer 170 can be deposited over the semiconductor layer 140 without having a layer 162 and/or a semiconductor contact layer 160 deposited between the metal layer 170 and the semiconductor layer 140.

Figure 7:
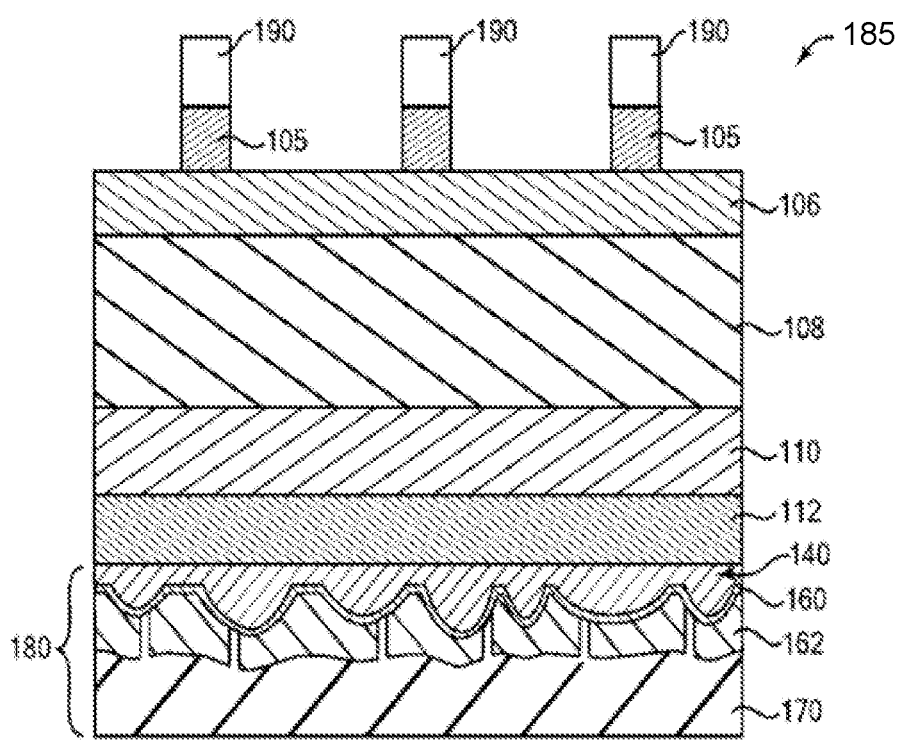
FIG. 7 illustrates a cross-sectional view of an example of a photovoltaic cell resulting after a lift-off process in accordance with aspects described in this disclosure.

In FIG. 7, the optoelectronic device 185 is shown flipped over in orientation after a lift-off process has removed some of the layers shown in previous Figures. Once the epitaxial layers have been formed for the photovoltaic device 100 as shown in FIG. 6, some layers of the photovoltaic device 100, such as the p-n layer 120, and the textured layer 180 (including the semiconductor layer 140) can be separated from the growth wafer 101 and any buffer layer(s) 102 during an ELO process.

In one example, the optoelectronic device 100 can be exposed to an etchant solution in order to etch the sacrificial layer 104 and to separate the p-n layer 120 from the growth wafer 101 during an epitaxial lift off (ELO) process. FIG. 7 shows aspects of an example of the p-n layer 120 in its resulting orientation, with the front of the p-n layer 120 oriented at the top of the cell, where light impinges on and enters the p-n layer 120. The textured layer 180 thus acts as a back reflector at a position further from the front of the p-n layer 120 than the p-n junction formed by the absorber (or base) and emitter layers. Once separated, the p-n layer 120 can be further processed to form a variety of optoelectronic devices, including photovoltaic cells and modules, and other devices described above. For example, metal contacts 190 can be deposited on the front contact layer 105. In some implementations, the photovoltaic cell or module is physically flexible after the ELO process.

Figure 8:
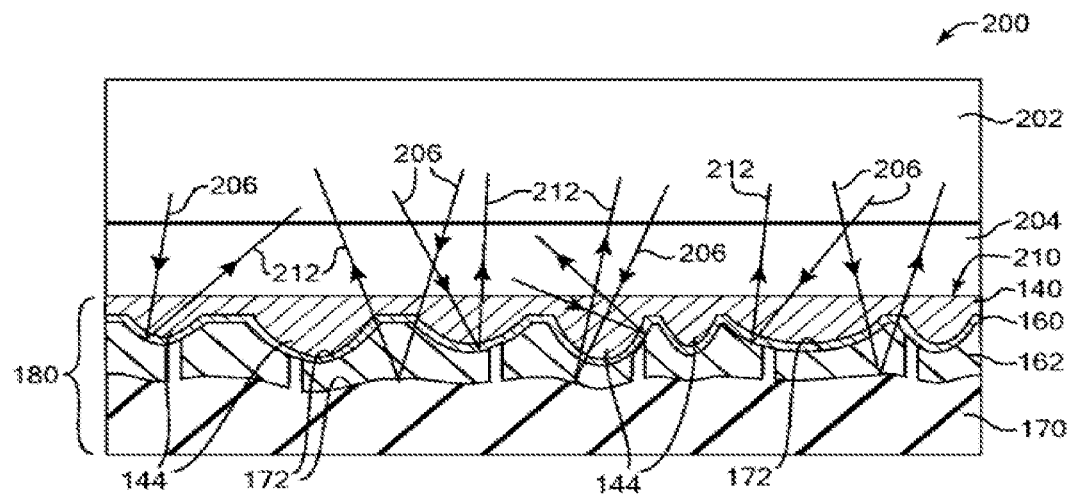
FIG. 8 illustrates a cross-sectional view of a photovoltaic cell illustrating scattering of light by a textured layer on a back side of a device in accordance with aspects described in this disclosure.

In some embodiments the first contact layer is a front contact layer, the first window layer is a front window layer, the second window layer is a back window layer, and the second contact layer 112 is a back contact layer. In other embodiments the first contact layer is a back contact layer, the first window layer is a back window layer, the second window layer is a front window layer, and the second contact layer 112 is a front contact layer FIG. 8 shows a diagram illustrating a portion 200 of the p-n layer 120 of FIG. 7, and in which light is received by the textured layer 180 acting as a back reflector layer. An active layer or region 202 is provided over a textured layer 180, also referred to as a textured reflective layer. For example, the active layer 202 can be a solar cell active region such as an emitter layer 110 and/or absorber layer 108. One or more other layers 204 can also be positioned between the active layer 202 and the textured layer 180 in some implementations.

As illustrated by the arrows in FIG. 8, light 206 has traveled into the cell 120 and has not been absorbed by the upper layers. This light 206 emerges from the active layer 202 and impinges on the front surface 210 of the textured layer 180. The light 206 passes through the transparent material of the semiconductor layer 140. In some implementations, the semiconductor layer 140 has received etching (e.g., temporally non-uniform etching process) prior to subsequent processing steps. Some of the photons of the light 206 can hit a surface of the layer 162 and are reflected from that layer. Other photons of the light 206 can pass through the layer 162 and can hit a surface of the back metal layer 170 and are reflected from that layer. The reflected photons are directed back through the semiconductor layer 140 and then into the active layer 202 as indicated by arrows 212, where they can "bounce around" and can be captured by the absorber layer 108 and emitter layer 110 and further generate current in the cell 120.

The features of the texturing of the semiconductor layer 140 create recesses 172 in the layer 162 and the back metal layer 170. This creates a randomized, roughened, and angled front surface of the layer 162 and the back metal layer 170. The textured layer 180 diffuses or scatters photons that pass through the active layer 202 without being absorbed. The texturing of the textured layer 180 (e.g., the microscopic, non-uniform surface features) can provide new angles to incident photons, some of which can be redirected back through the semiconductor layer 140 and towards the interior of the cell 120. Although some of the light can be absorbed by the semiconductor layers as the photons are scattered and redirected inside, much of the light is redirected to the active layer 202. The different angles on the surfaces of the textured layer 180 and its recesses 172 thus effectively cause the photons of the light 206 to reflect at random angles back into the active layer 202 to allow a greater amount of them to be recaptured by the active layer and converted into electrical energy, thereby increasing the light trapping properties of the cell 120 and increasing efficiency.

Figure 9:
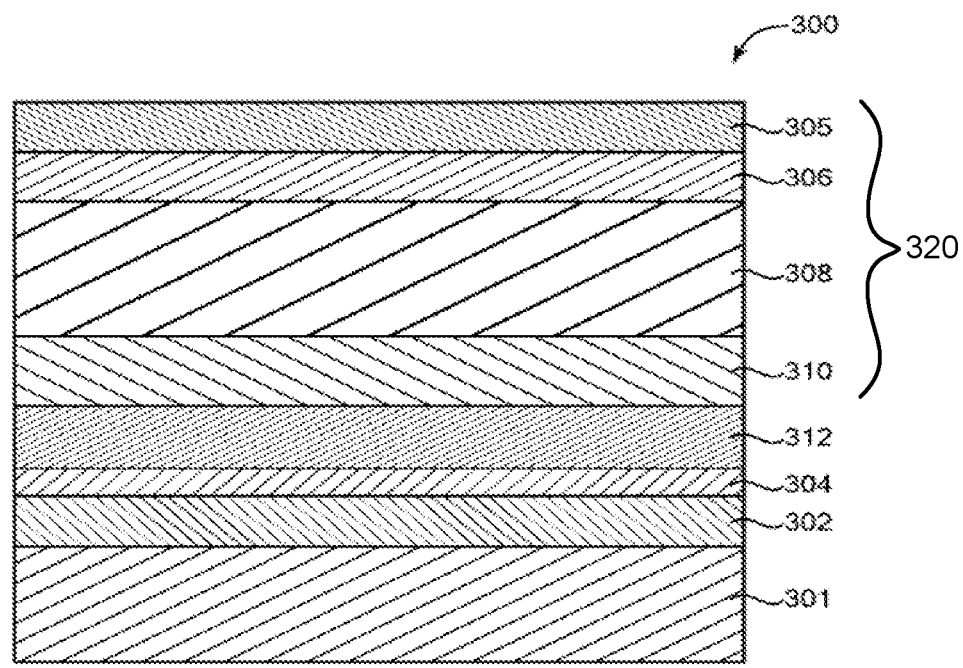
FIG. 9 illustrates a cross-sectional view of a photovoltaic device providing a front side light trapping textured layer in accordance with aspects described in this disclosure.

FIG. 9 is a cross-sectional view of an implementation of a photovoltaic device 300 suitable for providing a textured layer at a front side of the device. A textured layer can be provided for light trapping at the front side of a photovoltaic cell instead of, or in addition to, the back-side light trapping described above. This allows light impinging on the front side of the photovoltaic device to become scattered in the device by a textured surface created by the textured layer, increasing light trapping in the device.

The photovoltaic device 300 includes a p-n layer or cell 320 coupled with a growth wafer 301 by an ELO release layer or sacrificial layer 304 disposed therebetween. In some implementations, one or more buffer layers 302 can be formed on the growth wafer 301 in order to start forming the photovoltaic device 300. Layers of the photovoltaic cell 320 can be deposited over the sacrificial layer 304, which in some implementations can include a back semiconductor contact layer 312, an emitter layer 310 over the back semiconductor contact layer 312, a base layer 308 over the emitter layer 310 (or emitter layer 310 over the base layer 308), a front window or passivation layer 306 over the absorber layer 308, and a layer 305 for texturing, provided over the window layer 306. The layer 305 for texturing is similar to the second contact layer 112 described above with reference to FIGS. 1A and 1B.

As described above with respect to the p-n layer 120, the p-n layer 320 can include different layers, a non-limiting example of a combination of layers being shown in FIG. 9.

In some implementations, the back contact layer 312 can be comprised of a non-metal Group III-V semiconductor material, such as gallium arsenide.

In other implementations, the photovoltaic device 300 is not grown on a sacrificial or ELO release layer structure as shown. For example, in other implementations, the photovoltaic device 300 is not included an ELO lift-off procedure and is grown on a substrate without the sacrificial layer 104 or buffer layers 302.

Figure 10:
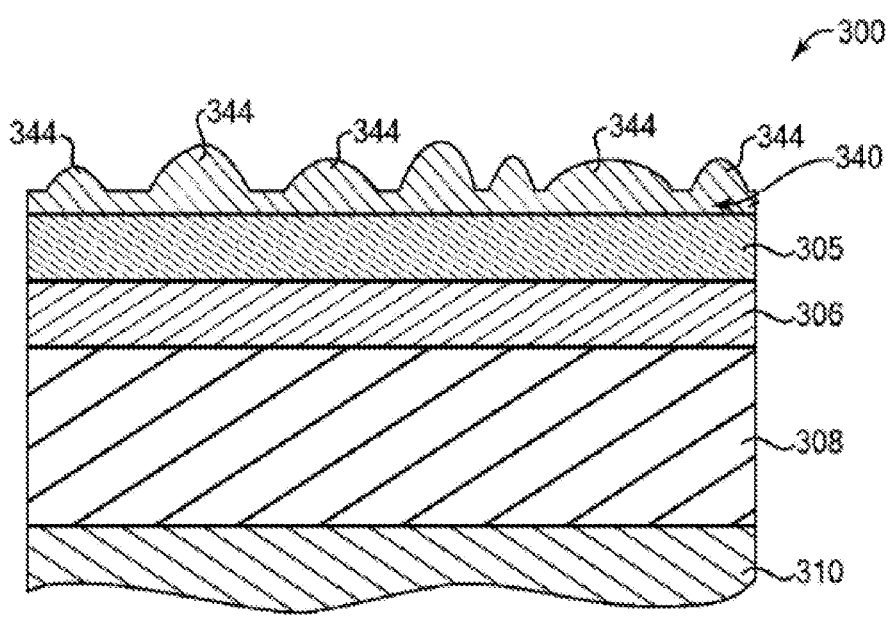
FIG. 10 illustrates a cross-sectional view of the photovoltaic device of FIG. 9 with a textured surface in accordance with aspects described in this disclosure.

FIG. 10 is a cross-sectional view of the photovoltaic device 300 including a deposition of a semiconductor layer 340 on the layer 305 according to one implementation of a textured layer for use as a front side light trapping layer. The semiconductor layer 340 can provide a textured surface formed using the etching processes described herein to cause light reflection and scattering in the device, increasing light trapping. In some implementations, the semiconductor layer 340 has received etching (e.g., inhomogeneous etching process) prior to subsequent processing steps.

Figure 11:
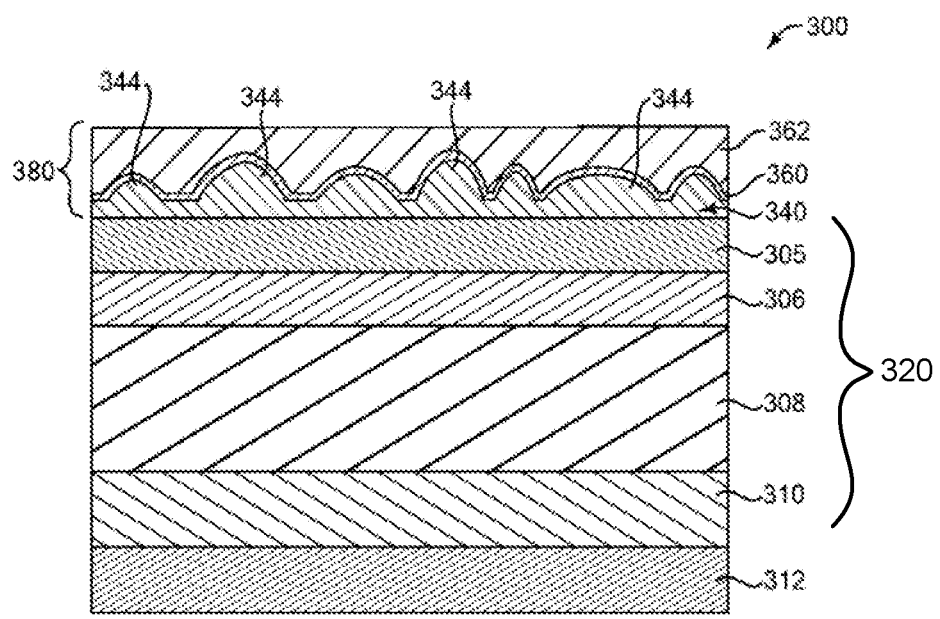
FIG. 11 illustrates a cross-sectional view of the photovoltaic device of FIG. 10 in which layers have been deposited over the textured surface in accordance with aspects described in this disclosure.

In FIG. 11, the photovoltaic device 300 has been further developed by depositing layers over the semiconductor layer 340. In some implementations, as in the example shown in FIG. 11, an optional semiconductor contact layer 360 is deposited over the semiconductor layer 340.

An anti-reflective coating (ARC) 362 can be deposited over the semiconductor contact layer 360 (if present) or over the semiconductor layer 340 (if the semiconductor contact layer 360 is not present). The ARC layer 362 includes a dielectric material that allows light to pass through while preventing light reflection from the surface of the ARC layer 362. In some implementations, the ARC layer 362 can comprise multiple layers.

In ELO implementations, the p-n layer 320 along with layers 340, 360, 362, and 312 can be removed from the ELO layers 301, 302, and 304 shown in FIG. 9 using an ELO process. After removal, the p-n layer 320 retains its orientation shown in FIGS. 9-11 and is not flipped over in orientation as for the back side reflector implementation described above. In other implementations, no ELO process is used for the p-n layer 320.

The layers 340, 360, and 362 provide a front side light-trapping textured layer 380. The front side location of the textured layer 380 allows it to receive light impinging on the device 300 and scatter the light at different angles into the lower layers of the device 300 due to the textured, randomized features in the semiconductor layer 340. This promotes light trapping as the photons bounce within the lower layers, allowing more of them to be absorbed to generate current.

In other implementations of the photovoltaic devices 100 and 300, other layer arrangements, doping arrangements, layer thickness, etc. can be used. For example, the emitter layer can be deposited over the absorber layer in some implementations. Moreover, the implementations of the photovoltaic devices 100 and 300 can be combined to produce photovoltaic devices that have both front-side and back-side textured surfaces form based on the etching techniques described herein.

Aspects of the non-uniform etching process described above for creating or producing textured surfaces (e.g., texturing in the semiconductor layers 140, 340, and the textured layers 180, 380) are described in more detail below.

In an aspect, the etching process for generating textured surfaces described above may be performed between 4° C. to 70° C. with or without stirring. For the etching process, the surface preparation may include a surface pre-clean, although the surface pre-clean may not be necessary. The surface may be cleaned to remove organic contamination and native oxide layer before etching. The surface may be cleaned using one or more acids, bases, and solvents that are capable of removing oxides, including sulfuric acid and ammonium hydroxide.

The feature sizes or scale of the textured surfaces produced from the etching are between 10 nm and 1000 nm, and more generally between 300 nm and 600 nm, and in some cases between 300 nm and 400 nm. These feature sizes can refer to both lateral and vertical (depth) feature sizes. In some instances, the upper range of the lateral features sizes can extend significantly, up to 5 microns.

The etch rate used in the non-uniform etching process is in the range of 10 nm/min and 1000 nm/min, and more generally averaging about 300 nm/min. In some instances, however, the lower end of the etch rate can be 5 nm/min. The etching process has different etching rates at the start of the process and at subsequent times. In an embodiment, the spatial non-uniformity of the textured surfaces or textured materials described above may result in part from the use of the non-uniform etching process described herein. Aspects other than the change in etching rate may also influence the spatial non-uniformity of the textured surfaces or textured materials The thickness of the etched layer (e.g., the semiconductor layer to be etched) can be greater than 1000 nm. As described above, the layer to be etched can have a thickness of about microns. In a non-limiting example, the material of the etched layer can be $Al_xGa1-xAs$, $0 \leq x \leq 0.8$.

The chemistry of the etching solution used for the non-uniform etching process may include the use of oxidizing agents to form an oxide on the surface of the Group III-V semiconductor materials and another chemical component that etches or removes the oxide that is formed. In an example, the etching solution may include an acid and hydrogen peroxide as the chemical components. The chemical ratios are typically in the range of 1:1-1:100 for one chemical component relative to the other, with varying dilution with water to control etch rate.

In other aspects of the chemistries used in connection with the etching process, the surface preparation can involve the use of organic solvents for removal of organic residue including acetone and isopropanol, and the use of uniform oxide growth promoters such as hydrogen peroxide. Oxide etchants including hydrochloric acid, sulfuric acid, ammonium hydroxide, and nitric acid, and mixtures of these can be used. Other chemistries that can be use include organic solvents such as toluene, benzene, chlorobenzene, xylene, PGMEA, and chloroform, and oxide etchants such as KOH, HF, citric acid, Iodic acid, and phosphoric acid.

In other aspects of the chemistries used in connection with the etching process, etch chemistries that can be used include combinations of organic acids, sulfuric acid, hydrochloric acid, nitric acid, ammonium hydroxide, and hydrogen peroxide, as well as Iodic acid, phosphoric acid, HF, and citric acid.

Figure 12A:
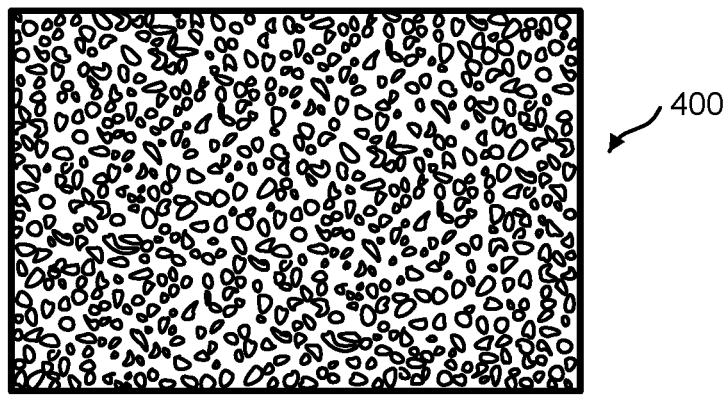
FIGS. 12A-12C illustrate surface images at different etching times for a temporally non-uniform etching process in accordance with aspects described in this disclosure.
Figure 12B:
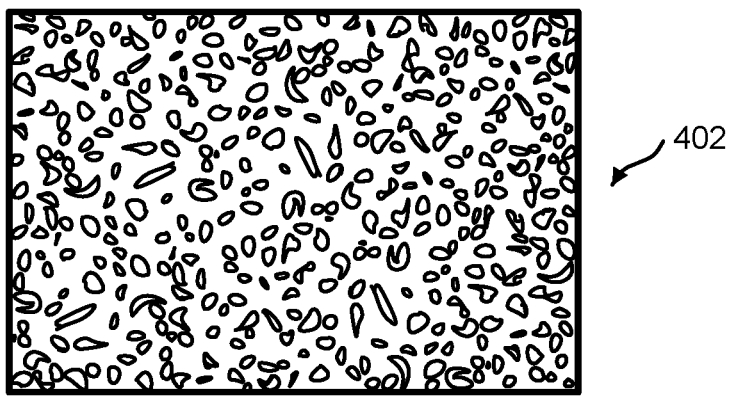
Figure 12C:
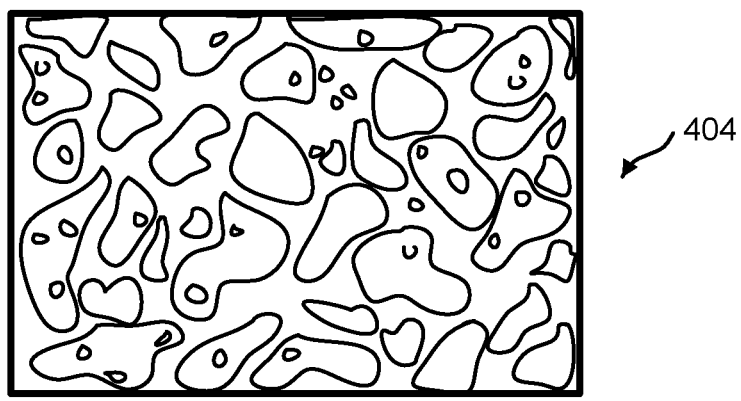

FIGS. 12A-12C illustrate surface images at different etching times for an inhomogeneous etching process in accordance with aspects described in this disclosure. For example, the etching times in FIGS. 12A-12C can range from about 30 seconds to 1 hour. FIG. 12A shows a characterization of a scanning electrode microscope (SEM) image 400 after a first etching time, FIG. 12B shows a characterization of an SEM image 402 after a second etching time subsequent to the first etching time, and FIG. 12C shows a characterization of an SEM image 404 after a third etching time subsequent to the second etching time. Before the first etching time there is a particle aggregation process or effect, and after the second etching time there is a surface roughening effect. Accordingly, it is possible to characterize the etching process described herein to include a first portion associated with a first time period of the etching process that provides a particle aggregation effect, and a second portion associated with a second time period of the etching process that provides a surface roughening effect.

Figure 13A:
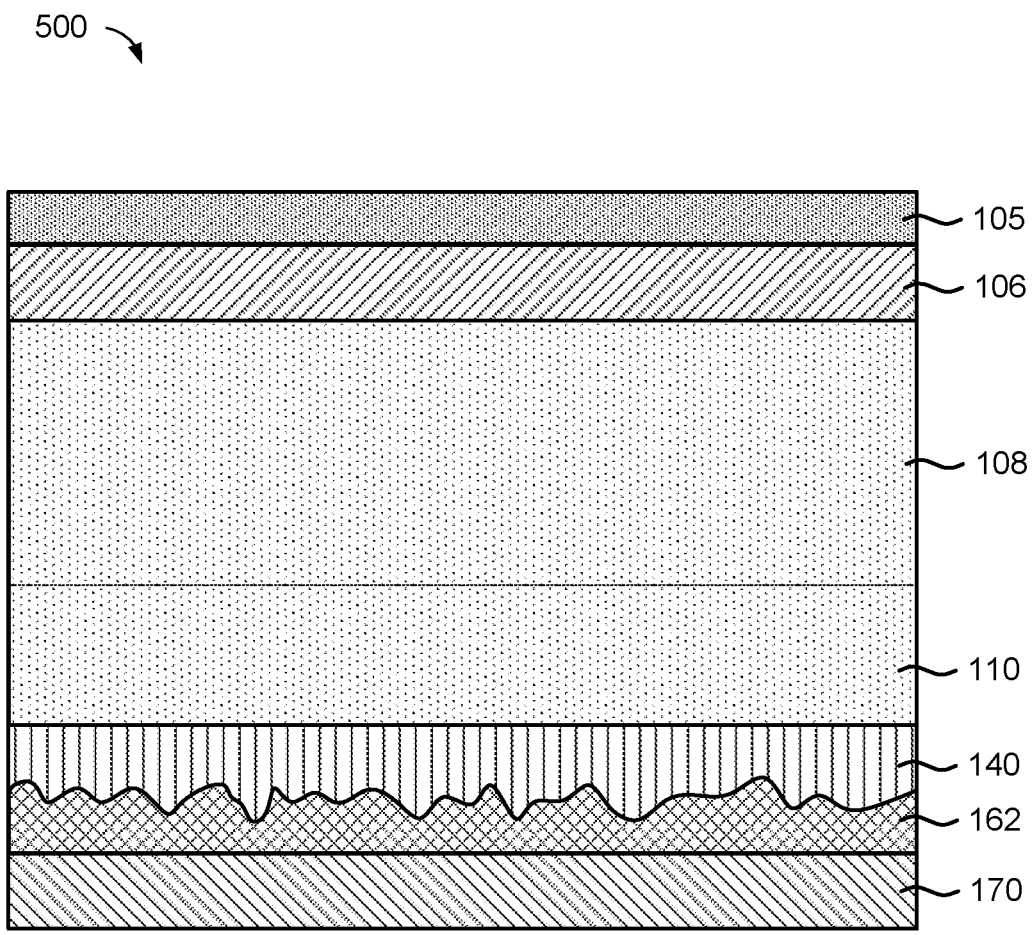
FIG. 13A illustrates a cross-sectional view of a photovoltaic device with a textured semiconductor layer etched using an etching period in accordance with aspects described in this disclosure.

FIG. 13A illustrates a cross-sectional view of a photovoltaic device 500 with a textured semiconductor layer etched using an etching period in accordance with aspects described in this disclosure. The photovoltaic device 500 can include a front contact layer 105, a front window 106, an absorber layer 108, an emitter layer 110, a semiconductor layer 140, a layer 162, and a metal layer 170. The semiconductor layer 140 in FIG. 13A is shown having a first textured surface.

Figure 13B:
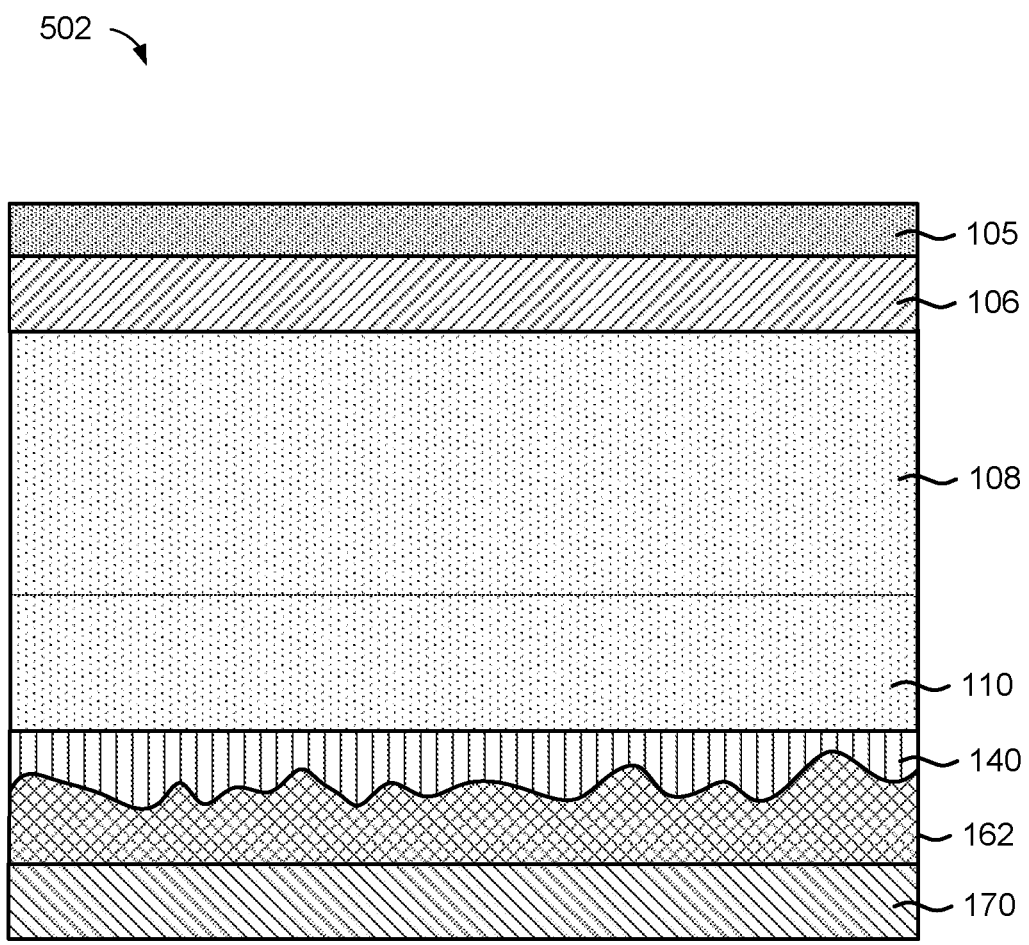
FIG. 13B illustrates a cross-sectional view of a photovoltaic device with a textured semiconductor layer etched using another etching period in accordance with aspects described in this disclosure.

FIG. 13B illustrates a cross-sectional view of a photovoltaic device 602 with a textured semiconductor layer etched using another etching period in accordance with aspects described in this disclosure. The photovoltaic device 602, like the photovoltaic device 600 in FIG. 16B, can include a front contact layer 105, a front window 106, an absorber layer 108, an emitter layer 110, a semiconductor layer 140, a layer 162, and a metal layer 170. The semiconductor layer 140 in FIG. 13B is shown having a second textured surface different from the first textured surface on the semiconductor layer 140 in FIG. 13A because of the different etching period.

Figure 14:
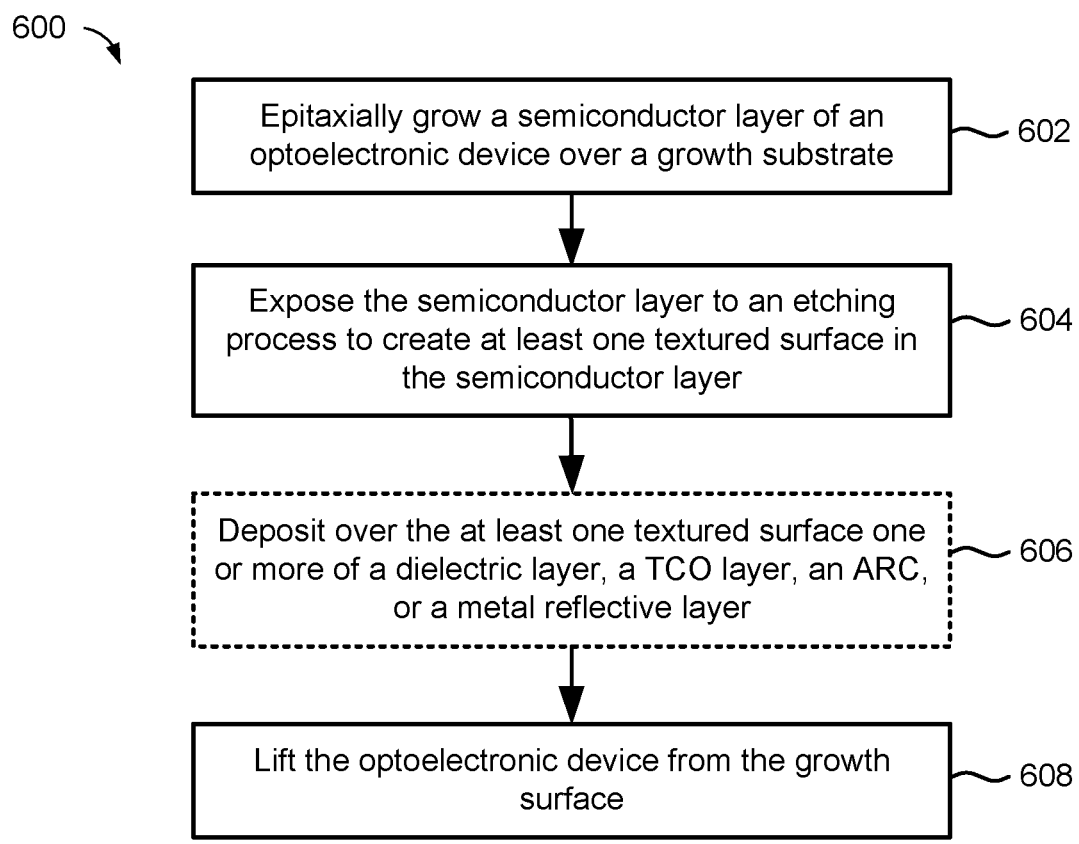
FIG. 14 illustrates a flowchart of a method for texturing a semiconductor layer using an etching process in accordance with aspects described in this disclosure.

FIG. 14 illustrates a flowchart of a method 600 for texturing a semiconductor layer in an optoelectronic device (e.g., a photovoltaic device) using an etching process in accordance with aspects described in this disclosure.

At block 602, the method 600 includes epitaxially growing a semiconductor layer of the optoelectronic device on a growth substrate. The semiconductor layer includes at least one or more of gallium, aluminum, indium, phosphorus, nitrogen, or arsenic.

At block 604, the method 600 includes exposing the semiconductor layer to an etching process (e.g., an inhomogeneous etching process that produces microscopically non-uniform features) to create at least one textured surface in the semiconductor layer.

In another aspect of the method 600, optionally at block 606, one or more of a dielectric layer, a TCO layer, an ARC, a high-resistivity transparent (HRT) layer, or a metal reflective layer are deposited over the at least one textured surface.

At block 608, the optoelectronic device is lifted from the growth surface to separate the device from the growth surface. The lifting may be performed based on an ELO process, for example.

In other aspects of the method 600, the etching process can be performed without the use of a template layer, lattice mismatching of layers, or both. The etching process can be a spatially non-uniform etching process, and the at least one textured surface includes spatially non-uniform features. The etching process can be done or performed by a liquid or solution-based chemical etchant, or by one or more of gas etching, laser etching, plasma etching, or ion etching.

In other aspects of the method 600, the at least one textured surface is configured to cause scattering of light. The at least one textured surface is configured to cause photons to scatter at randomized angles.

Figure 15:
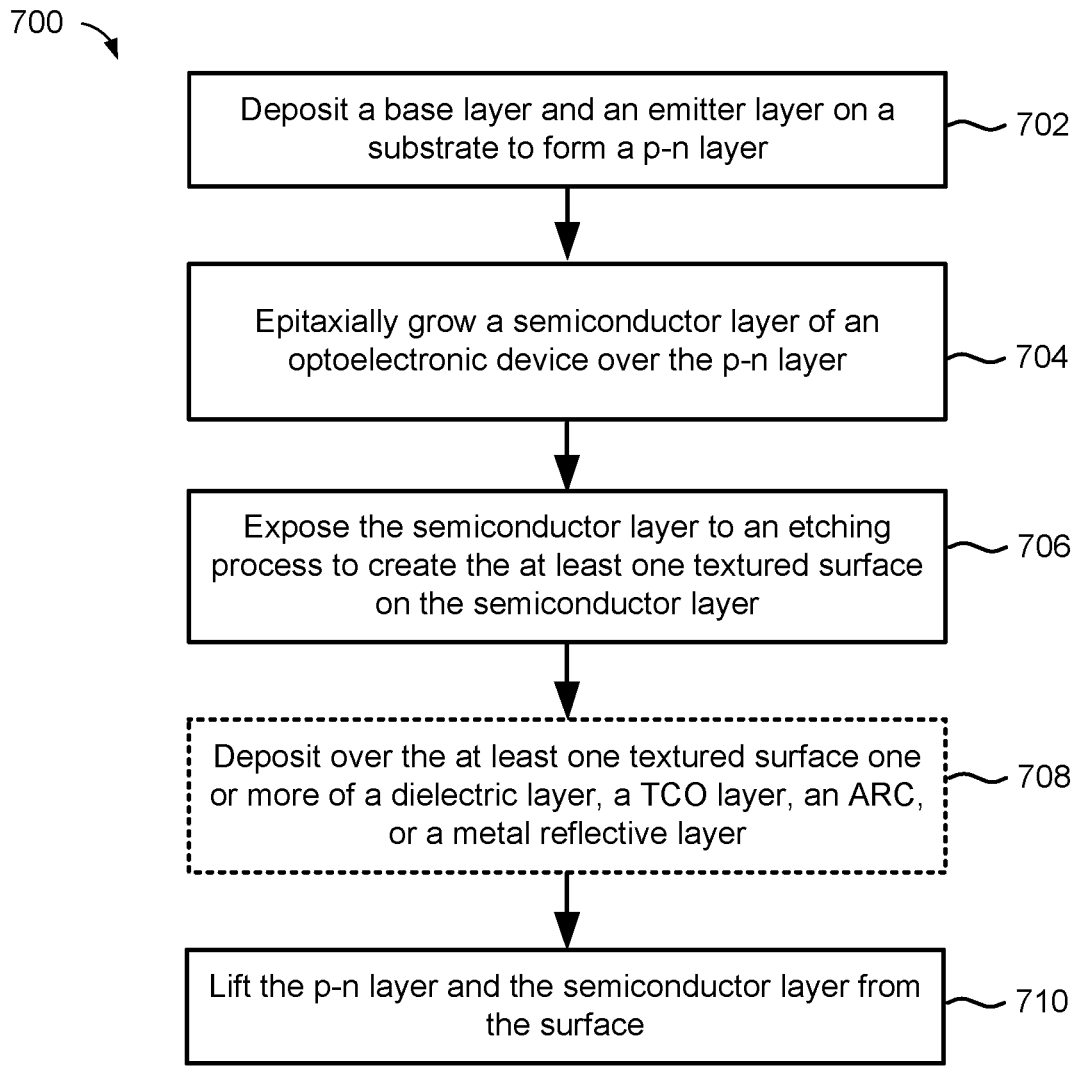
FIG. 15 illustrates a flowchart of another method for texturing a semiconductor layer using an etching process in accordance with aspects described in this disclosure.

FIG. 15 illustrates a flowchart of another method 700 for texturing a semiconductor layer in an optoelectronic device (e.g., a photovoltaic device) using an etching process in accordance with aspects described in this disclosure.

At block 702, the method 700 includes depositing an emitter layer and a base layer over a growth substrate.

At block 704, the method 700 includes epitaxially growing a semiconductor layer of the optoelectronic device over the emitter layer and the base layer. The semiconductor layer includes at least one or more of gallium, aluminum, indium, phosphorus, nitrogen, or arsenic.

At block 706, the method 700 includes exposing the semiconductor layer to an etching process (e.g., an inhomogeneous etching process that produces microscopically non-uniform features) to create at least one textured surface in the semiconductor layer.

In another aspect of the method 700, optionally at block 708, one or more of a dielectric layer, a TCO layer, an ARC, a high-resistivity transparent (HRT) layer, or a metal reflective layer are deposited over the at least one textured surface.

At block 710, the optoelectronic device is lifted from the growth surface to separate the device from the growth surface. The lifting may be performed based on an ELO process, for example.

Implementations of optoelectronic devices and methods to provide such devices described herein can provide a textured layer (e.g., textured semiconductor layer) created for a textured surface allowing increased light trapping. Disclosed implementations and aspects also can provide advantages over previous light trapping layer formation techniques, including greater flexibility, reduced cost, and increased layer growth rate, saving time and expense in the manufacture of devices.

Although aspects of the present disclosure have been described in accordance with the various examples and implementations shown, one of ordinary skill in the art will readily recognize that there could be variations to the examples and implementations. Accordingly, many modifications can be made by one of ordinary skill in the art without departing from the present disclosure and the appended claims.

What is claimed is:

1. A method for providing at least one textured layer in an optoelectronic device, the method comprising:
    forming a reflective back metal layer having a flat surface;
    forming an absorber layer on the reflective back metal layer to have a first thickness;
    epitaxially growing a semiconductor layer to have a second thickness less than the first thickness of the absorber layer, with the semiconductor layer being positioned between the flat surface of the reflective back metal layer and the absorber layer; and positioning an emitter layer between the absorber layer and the semiconductor layer, wherein the emitter layer and the absorber layer form a p-n junction of the optoelectronic device, wherein the absorber layer is further positioned between the semiconductor layer and a surface of the optoelectronic device on which light is to be incident.

2. The method of claim 1, further comprising forming a planar interface between the emitter layer and the semiconductor layer.

3. The method of claim 1, wherein the semiconductor layer includes at least one inhomogeneous textured surface.

4. The method of claim 1, further comprising separating the optoelectronic device from a growth substrate via an epitaxial lift off (ELO) process.

5. The method of claim 3, further comprising forming the at least one inhomogeneous textured surface to be configured to cause scattering of light.

6. The method of claim 5, wherein the at least one inhomogeneous textured surface is configured to cause photons to scatter at randomized angles.

7. The method of claim 1, wherein the semiconductor layer includes at least one or more of gallium, aluminum, indium, phosphorus, nitrogen, or arsenic.

8. The method of claim 1, further comprising depositing, over the at least one textured layer, one or more of:
   a dielectric layer,
   a transparent conducting oxide (TCO) layer,
   an anti-reflective coating, a metal reflective layer, or
   a high-resistivity transparent (HRT) layer.

9. The method of claim 1, forming at least one inhomogeneous textured surface to be part of a front window layer positioned closer to a front side of the optoelectronic device than the p-n junction of the optoelectronic device that includes the absorber layer.

10. The method of claim 1, forming the optoelectronic device to be part of a solar cell or part of a light-emitting diode.

* * * * *